United States Patent
Maruko

(10) Patent No.: US 9,054,689 B2
(45) Date of Patent: Jun. 9, 2015

(54) PHASE COMPARISON CIRCUIT AND DATA RECEIVING UNIT

(71) Applicant: Sony Corporation, Tokyo (JP)

(72) Inventor: Kenichi Maruko, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/156,770

(22) Filed: Jan. 16, 2014

(65) Prior Publication Data

US 2014/0203842 A1 Jul. 24, 2014

(30) Foreign Application Priority Data

Jan. 21, 2013 (JP) .................................. 2013-008098

(51) Int. Cl.
*H03L 7/085* (2006.01)
*H03K 3/3562* (2006.01)

(52) U.S. Cl.
CPC ............ *H03K 3/35625* (2013.01); *H03L 7/085* (2013.01)

(58) Field of Classification Search
CPC ............... H03D 13/003; H03D 13/004; H03L 7/085–7/0891; H03L 7/091; H03K 5/26; G01R 25/00; G01R 25/005
USPC ................... 327/2, 3, 5, 7–10, 12, 147–150, 327/156–159; 331/25; 375/375, 376
See application file for complete search history.

(56) References Cited

U.S. PATENT DOCUMENTS

| | | | | |
|---|---|---|---|---|
| 4,535,459 | A * | 8/1985 | Hogge, Jr. ...................... | 375/324 |
| 5,512,860 | A * | 4/1996 | Huscroft et al. ............... | 331/1 A |
| 7,092,474 | B2 * | 8/2006 | Cao .................................. | 375/375 |
| 8,624,630 | B2 * | 1/2014 | Liao et al. ........................ | 327/3 |
| 2012/0120287 | A1 * | 5/2012 | Funamoto et al. ............. | 348/246 |
| 2014/0177771 | A1 * | 6/2014 | Maruko et al. ................. | 375/375 |

FOREIGN PATENT DOCUMENTS

JP 2002-314387 10/2002

* cited by examiner

*Primary Examiner* — Patrick O'Neill
(74) *Attorney, Agent, or Firm* — Dentons US LLP

(57) ABSTRACT

A phase comparison circuit includes: a first flip-flop configured to receive a data signal and a clock signal; a second flip-flop configured to receive an output signal of the first flip-flop and a signal that is an inversion of logic of the clock signal; a delay circuit configured to give delay time to the data signal, in which the delay time is equal to or longer than signal delay time from a clock terminal of the first flip-flop to a Q output terminal of the first flip-flop; a first exclusive OR circuit configured to receive an output signal of the delay circuit and the output signal of the first flip-flop; and a second exclusive OR circuit configured to receive the output signal of the first flip-flop and an output signal of the second flip-flop.

6 Claims, 16 Drawing Sheets

(Comparative Example)

(Comparative Example)

(Comparative Example)

(Comparative Example)

(Comparative Example)

(Comparative Example)

PHASE COMPARISON CIRCUIT AND DATA RECEIVING UNIT

CROSS REFERENCE TO RELATED APPLICATIONS

This application claims the benefit of Japanese Priority Patent Application JP 2013-8098 filed Jan. 21, 2013, the entire contents of each of which are incorporated herein by reference.

BACKGROUND

The present disclosure relates to a phase comparison circuit to be used for a clock and data recovery circuit, and a data receiving unit using the phase comparison circuit.

In a field of recent information devices or digital devices, fast serial transmission is widely used to transmit large-volume digital data at high speed and low cost. A receiver for the fast serial transmission reproduces a clock in synchronization with a predeterminately encoded, received data array and reproduces data with a clock and data recovery circuit (hereinafter, abbreviated as "CDR"). One of the components of CDR includes a phase comparison circuit.

Japanese Unexamined Patent Application Publication No. 2002-314387 discloses a phase comparison circuit that accurately outputs a phase difference between a data input signal DI and a clock input signal CI as a difference in pulse width between an UP signal and a DOWN signal.

SUMMARY

Recently, a higher data rate and lower power consumption of fast serial transmission are increasingly demanded in markets along with widespread use of high-performance information devices or high-performance digital devices. Such demands may lead to unstable operation of a phase comparison circuit contained in CDR.

It is desirable to provide a phase comparison circuit and a data receiving unit that each achieve higher speed and lower power consumption of fast serial transmission by maximizing the margin itself of clock timing.

According to an embodiment of the present disclosure, there is provided a phase comparison circuit, including: a first flip-flop configured to receive a data signal and a clock signal; a second flip-flop configured to receive an output signal of the first flip-flop and a signal that is an inversion of logic of the clock signal; a delay circuit configured to give delay time to the data signal, the delay time being equal to or longer than signal delay time from a clock terminal of the first flip-flop to a Q output terminal of the first flip-flop; a first exclusive OR circuit configured to receive an output signal of the delay circuit and the output signal of the first flip-flop; and a second exclusive OR circuit configured to receive the output signal of the first flip-flop and an output signal of the second flip-flop.

According to an embodiment of the present disclosure, there is provided another phase comparison circuit, including: a first flip-flop configured to receive a data signal and a clock signal; a second flip-flop configured to receive an output signal of the first flip-flop and a signal that is an inversion of logic of the clock signal; a delay circuit having a logical step number equal to or larger than a logical step number of the first flip-flop, and configured to give delay time to the data signal; a first exclusive OR circuit configured to receive an output signal of the delay circuit and the output signal of the first flip-flop; and a second exclusive OR circuit configured to receive the output signal of the first flip-flop and an output signal of the second flip-flop.

According to an embodiment of the present disclosure, there is provided a data receiving unit, including: a clock and data recovery circuit including a phase comparison circuit, an oscillator, a frequency divider, a frequency phase comparison circuit, a lock detector, and a multiplexer; a deserializer; and a decoder. The phase comparison circuit includes a first flip-flop configured to receive a data signal and a clock signal, a second flip-flop configured to receive an output signal of the first flip-flop and a signal that is an inversion of logic of the clock signal, a delay circuit configured to give delay time to the data signal, the delay time being equal to or longer than signal delay time from a clock terminal of the first flip-flop to a Q output terminal of the first flip-flop, a first exclusive OR circuit configured to receive an output signal of the delay circuit and the output signal of the first flip-flop, and a second exclusive OR circuit configured to receive the output signal of the first flip-flop and an output signal of the second flip-flop. The oscillator is configured to output the clock signal, the frequency divider is configured to output a feedback clock signal that is a division of the clock signal in a predetermined dividing ratio, the frequency phase comparison circuit is configured to output a signal that corresponds to a frequency difference and a phase difference between the data signal and the feedback clock signal, the lock detector is configured to output a determination signal that indicates whether each of the frequency difference and the phase difference between the data signal and the feedback clock signal is within a predetermined range or not, and the multiplexer is configured to receive the determination signal, and select one of a signal from the phase comparison circuit and a signal from the frequency phase comparison circuit. The deserializer is configured to perform serial-to-parallel conversion on the data signal with use of the clock signal. The decoder is configured to decode modulated data output from the deserializer.

According to the above-described embodiments of the disclosure, a margin itself of clock timing is maximized, thereby making it possible to provide the phase comparison circuit and the data receiving unit each achieving higher speed and lower power consumption of fast serial transmission.

Other issues, configurations, and effects will become apparent from the description of the following example embodiments. It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, some embodiments of the present disclosure are described according to the following example configuration.
[Overall Configuration of CDR, and Configuration and Operation of Phase Comparison Circuit] FIGS. 1, 2, and 3
[First Embodiment: Phase Comparison Circuit Including Delay Circuit Having Circuit Configuration Equal to Circuit Configuration of D flip-flop] FIG. 4
[Variations of First DFF and Delay Circuit] FIGS. 5A and 5B, FIGS. 6A and 6B, and FIGS. 7 to 9
[Second Embodiment: CDR Including Variable Delay Circuit and Delay Amount Control Section, and Phase Comparison Circuit] FIGS. 10A and 10B, FIG. 11, and FIGS. 12A and 12B Comparative Example Before describing example embodiments of the present disclosure, a comparative example is given and discussed hereinbelow.

Figure 14:
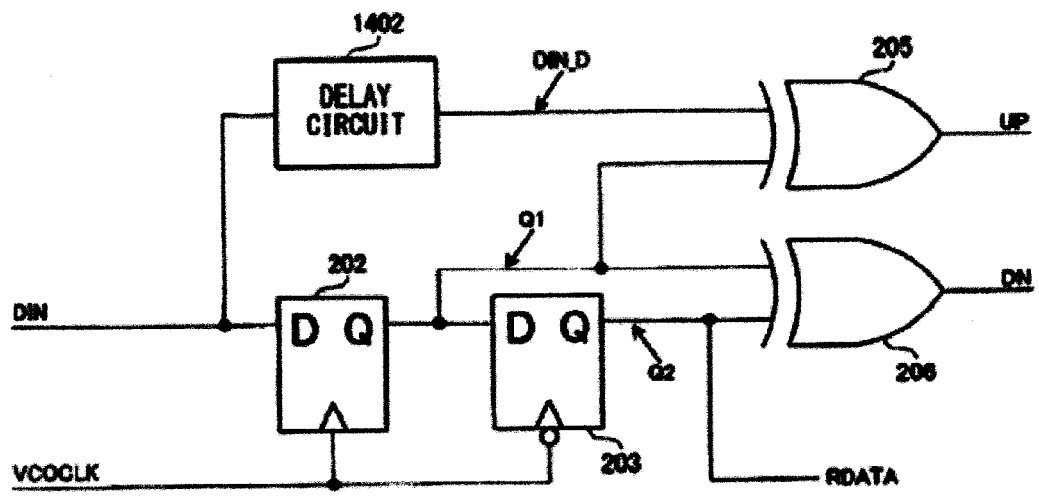
FIG. 14 is a circuit diagram of a phase comparison circuit according to a comparative example.

FIG. 14 is a circuit diagram of a phase comparison circuit 1401 according to a comparative example.

A data signal DIN is received by a delay circuit 1402 and the D terminal of a first D flip-flop (hereinafter, "D flip-flop" is abbreviated as "DFF") 202.

A clock signal VCOCLK is received by the clock terminal of the first DFF 202, and is also received by the clock terminal of a second DFF 203 while being inverted in logic.

A signal Q1 output from the Q terminal of the first DFF 202 and a delayed data signal DIN_D output from the delay circuit 1402 are received by a first exclusive OR gate (hereinafter, "exclusive OR gate" is abbreviated as "EXOR") 205. An output signal from the first EXOR 205 is a signal UP for phase advancement.

The signal Q1 and a signal Q2 output from the Q terminal of the second DFF 203 are received by a second EXOR 206. An output signal from the second EXOR 206 is a signal DN for phase delay. The signal Q2 output from the Q terminal of the second DFF 203 is supplied as a reproduction data signal RDATA to a subsequent deserializer 1310 (see FIG. 13) together with the clock signal VCOCLK.

The phase comparison circuit 1401 illustrated in FIG. 14 detects a phase difference between the data signal DIN and the clock signal VCOCLK, and outputs the phase difference as a time lag between pulse width of the signal UP and pulse width of the signal DN. The pulse width of the signal DN is half the period of the clock signal VCOCLK, and the pulse width of the signal UP is varied in correspondence to the phase difference between the data signal DIN and the clock signal VCOCLK. For example, when the phase difference between the data signal DIN and the clock signal VCOCLK is zero, each of the signal UP and the signal DN is a pulse signal having a pulse width of half the clock period. If the phase of the clock signal VCOCLK advances with respect to the data signal DIN, the pulse width of the signal UP is shorter than half the clock period. Conversely, if the phase of the clock signal VCOCLK delays with respect to the data signal DIN, the pulse width of the signal UP is longer than half the clock period.

Figure 15A:
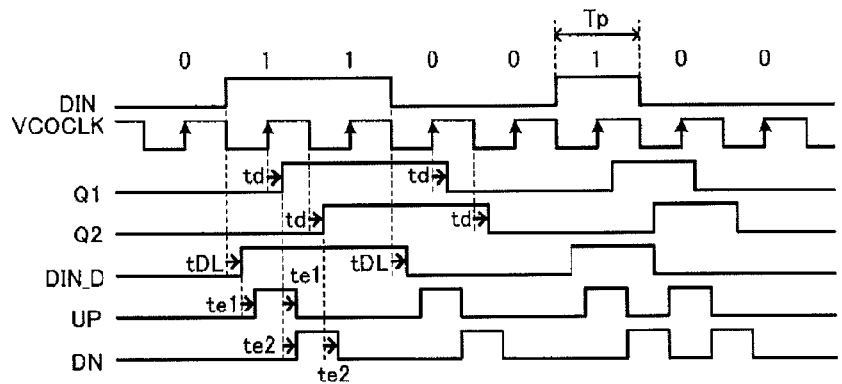
FIGS. 15A to 15C are each a timing chart of a phase comparison circuit according to a comparative example.
Figure 15B:
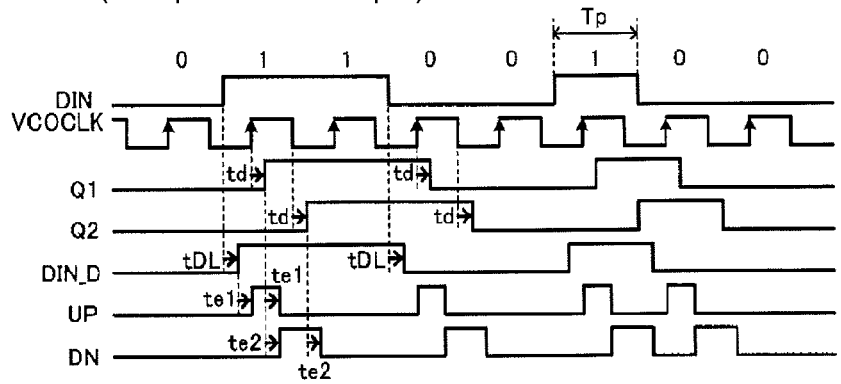
Figure 15C:
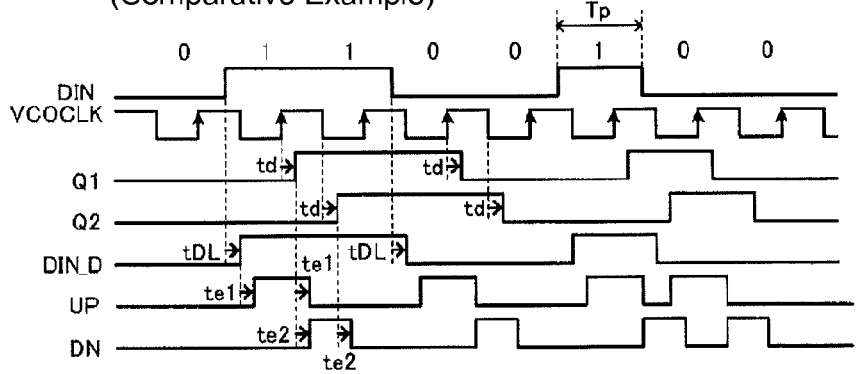

FIGS. 15A, 15B, and 15C are each a timing chart of the phase comparison circuit 1401.

FIG. 15A illustrates timing in a phasic relationship where the phase difference between the data signal DIN and the clock signal VCOCLK is zero.

The delay circuit 1402 delays the data signal DIN by delay time tDL, and outputs such a delayed data signal DIN as the delayed data signal DIN_D.

The first DFF 202 holds the data signal DIN at a rising edge of the clock signal VCOCLK, and then outputs the data signal DIN as the signal Q1. At this time, the first DFF 202 outputs the signal Q1 after a signal delay time td delay from a rising edge of the clock input. The signal delay time td is a signal delay time that necessarily occurs due to a MOSFET configuration of the first DFF 202.

FIG. 15A shows that since the phase difference between the data signal DIN and the clock signal VCOCLK is zero, the signal Q1 is a signal that is delayed with respect to the data signal DIN by the sum of half a period of the clock signal VCOCLK and the signal delay time td.

The second DFF 203 holds the signal Q1 at a falling edge of the clock signal VCOCLK, and then outputs such a held signal Q1 as the signal Q2. At this time, the second DFF 203 outputs the signal Q2 after a delay from the falling edge of the clock input. In the case where the second DFF 203 is configured of the same flip-flop as that of the first DFF 202, the delay time from the falling edge of the clock input to output of the signal Q2 is the signal delay time td as with the first DFF 202.

FIG. 15A shows that the signal Q2 is a signal that is delayed with respect to the data signal DIN by time corresponding to the sum of one period of the clock signal VCOCLK and the signal delay time td.

In the phase comparison circuit 1401, the signal UP is an output signal from the first EXOR 205. Similarly, the signal DN is an output signal from the second EXOR 206.

The signal UP is an output from the first EXOR 205 that receives the delayed data signal DIN_D and the signal Q1, and is a pulse signal that is at an H level when the delayed data signal DIN_D has a value different from a value of the signal Q1.

The signal DN is an output from the second EXOR 206 that receives the signal Q1 and the signal Q2, and is a pulse signal that is at an H level when the signal Q1 has a value different from a value of the signal Q2.

The first EXOR 205 and the second EXOR 206 are each also configured of MOSFET; hence, the first and second EXORs 205 and 206 have delayed time te1 and delayed time te2, respectively.

When a data period of the data signal DIN is Tp, the pulse width of the signal DN is Tp/2 as can be seen from an operation example illustrated in FIG. 15A. On the other hand, in the case of a phasic relationship where the phase difference between the data signal DIN and the clock signal VCOCLK is zero as illustrated in FIG. 15A, the pulse width Tup of the signal UP is represented by the following formula.

$$Tup=Tp/2+(td-tDL)$$

When the signal UP has a pulse width equal to that of the signal DN, there is established a phasic relationship where the phase difference between the data signal DIN and the clock signal VCOCLK is zero. Hence, the delay time tDL in the delay circuit 1402 is set to be equal to the signal delay time td in order to establish a relationship of td−tDL1=0.

FIG. 15B illustrates an operation example in the case of a phasic relationship where the clock signal VCOCLK advances in phase with respect to the data signal DIN.

FIG. 15B shows that since the clock signal VCOCLK advances in phase with respect to the data signal DIN, the signal Q1 is a signal that is delayed with respect to the data signal DIN by the sum of time shorter than half the period of the clock signal VCOCLK and the signal delay time td. In other words, the signal Q1 advances in phase compared with the signal Q1 in FIG. 15A in correspondence to the phase advancement of the clock signal VCOCLK.

On the other hand, the signal Q2 is a signal that is delayed with respect to the data signal DIN by the sum of one period of the clock signal VCOCLK and the signal delay time td. This is because a time difference due to series connection of the first DFF 202 and the second DFF 203 is constant, i.e., half the period of the clock signal VCOCLK.

Hence, in this case, although the pulse width of the signal UP is shortened in proportion to the phase difference between the data signal DIN and the clock signal VCOCLK, the pulse width of the signal DN is not varied, i.e., is maintained to be Tp/2.

FIG. 15C illustrates an operation example in the case of a phasic relationship where the clock signal VCOCLK delays in phase with respect to the data signal DIN.

FIG. 15C shows that since the clock signal VCOCLK delays in phase with respect to the data signal DIN, the signal Q1 is a signal that is delayed with respect to the data signal DIN by the sum of time longer than half the period of the clock signal VCOCLK and the signal delay time td. In other words, the signal Q1 delays in phase compared with the signal Q1 in FIG. 15A in correspondence to the delayed phase of the clock signal VCOCLK.

On the other hand, the signal Q2 is a signal that is delayed with respect to the data signal DIN by time corresponding to the sum of one period of the clock signal VCOCLK and the signal delay time td as in the above-described cases of FIGS. 15A and 15B.

Hence, in this case, although the pulse width of the signal UP is lengthened in proportion to the phase difference between the data signal DIN and the clock signal VCOCLK, the pulse width of the signal DN is not varied, i.e., is maintained to be Tp/2.

In this way, the phase comparison circuit 1401 detects the phase difference between the data signal DIN and the clock signal VCOCLK, and outputs the phase difference as a time lag between the pulse width of the signal UP and the pulse width of the signal DN.

Figure 16A:
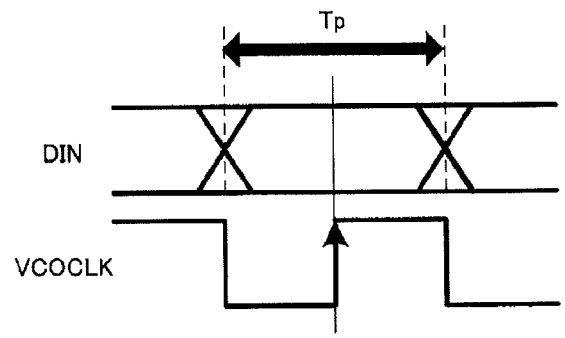
FIGS. 16A and 16B are each a timing chart illustrating a relationship between a data signal and a clock signal in first DFF 202 according to a comparative example.
Figure 16B:
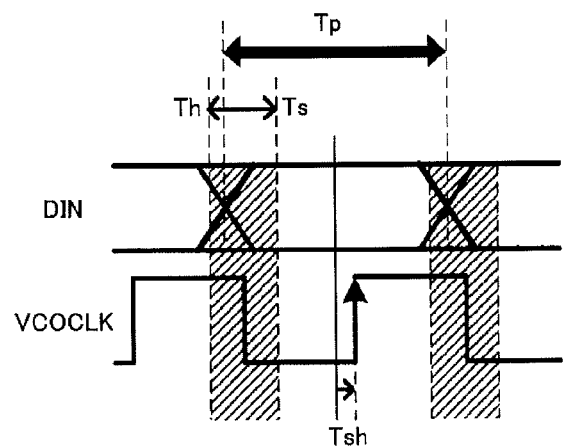

FIGS. 16A and 16B are each a timing chart illustrating a relationship between the data signal DIN and the clock signal VCOCLK in the first DFF 202 according to a comparative example.

As illustrated in FIG. 16A, in CDR using the phase comparison circuit 1401 according to the comparative example, the rising edge of the clock signal VCOCLK is locked at the middle of a transition period of a level of the data signal DIN. If setup time and holding time of the first DFF 202 are not considered, locking in such a phasic relationship maximizes a timing margin of each of the data signal DIN and the clock signal VCOCLK, and is thus optimum for characteristics of the CDR.

However, if the setup time and the holding time of the first DFF 202 are considered, locking of a phase-locked loop (PLL) at the phase difference of zero between the data signal DIN and the clock signal VCOCLK is not necessarily optimum for the characteristics of the CDR as illustrated in FIG. 16B.

If the setup time Ts and the holding time Th of the first DFF 202 are considered, and when a rising edge of the clock signal VCOCLK is within a period indicated with oblique lines in FIG. 16B, the first DFF 202 is in a metastable state including oscillation of a gate circuit configuring the inside thereof, and fluctuation in voltage level between High and Low. As a result, the voltage of the output signal from the first DFF 202 becomes unstable, thus making it difficult to output the signal Q1 while the data signal DIN is appropriately held at the rising edge of the clock signal VCOCLK.

Hence, to avoid such a metastable state as much as possible, it is basically desirable to lock the PLL in a phasic relationship where a position of the rising edge of the clock signal VCOCLK is shifted such that a margin of each of the setup time and the holding time is maximized as illustrated in FIG. 16B. Specifically, the PLL is desirably locked in a state where the position of the rising edge of the clock signal VCOCLK is at the middle of a period excluding the periods indicated with oblique lines in FIG. 16B.

When the rising edge of the clock signal VCOCLK is optimally delayed (shifted) such that the margin of each of the setup time and the holding time is maximized as illustrated in FIG. 16B, such optimally delayed (shifted) time is defined as optimal shift time Tsh.

Recently, a higher data rate and lower power consumption of fast serial transmission are increasingly demanded in markets along with widespread use of high-performance information devices or high-performance digital devices. Such demands may lead to unstable operation of the phase comparison circuit contained in CDR.

Such an issue of the metastable state is more significantly actualized along with a decrease in margin of clock timing due to the higher data rate and lower power consumption, and is also a large obstructive factor for further fast serial transmission.

[Overall Configuration of CDR, and Configuration and Operation of Phase Comparison Circuit]

First, technical idea common to the first and second embodiments of the present disclosure is described with reference to FIGS. 1, 2, and 3.

Figure 1:
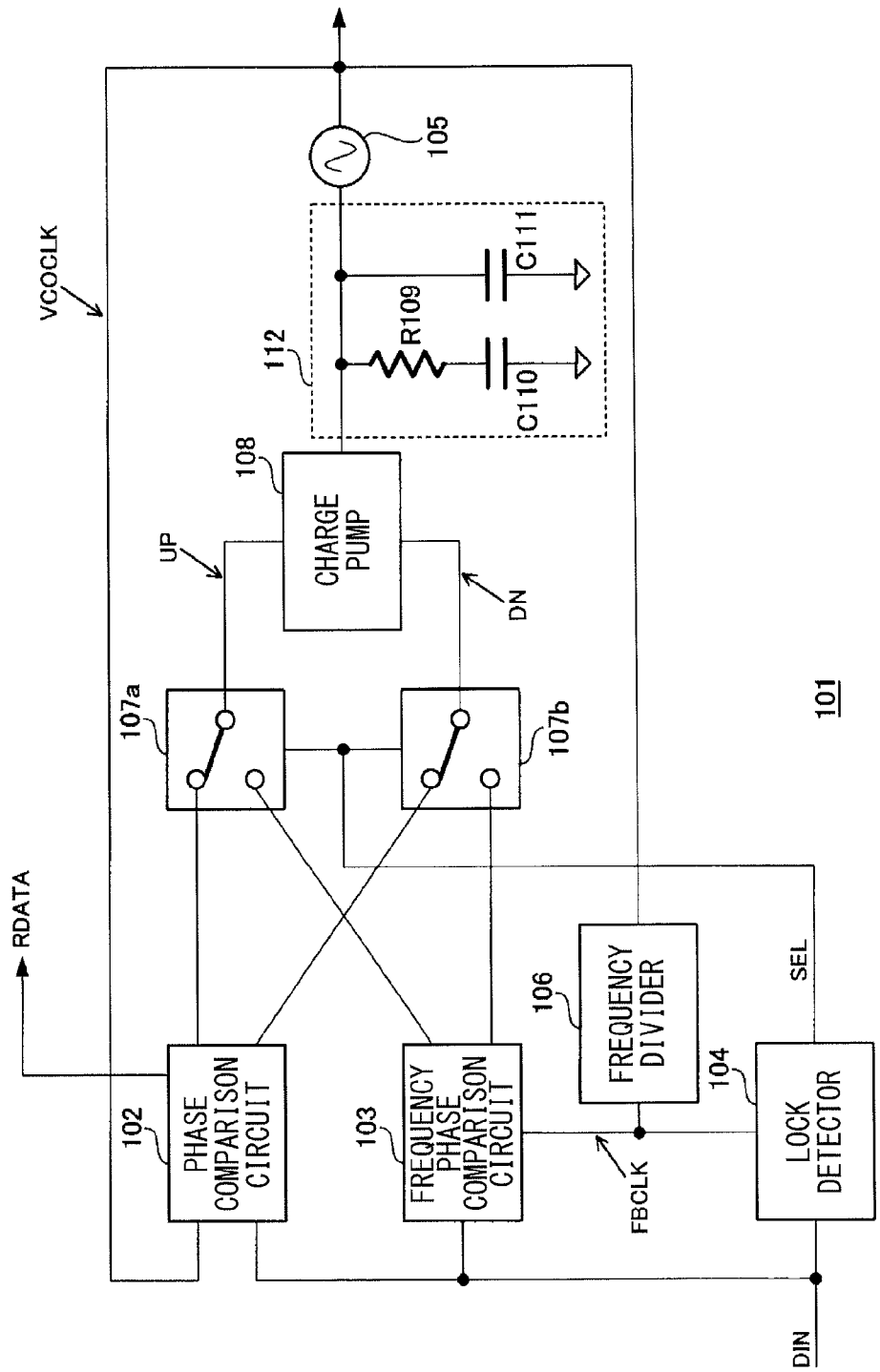
FIG. 1 is a block diagram of CDR according to one embodiment of the present disclosure.

FIG. 1 is a block diagram of CDR 101 according to one embodiment of the disclosure.

A data signal DIN is received by each of a phase comparison circuit 102, a frequency phase comparison circuit 103, and a lock detector 104.

The phase comparison circuit 102 compares a phase of a voltage control oscillator 105 to a phase of a clock pattern of the data signal DIN, and outputs a control signal corresponding to such a comparison result.

The frequency phase comparison circuit 103 compares frequency and a phase of a feedback clock signal FBCLK output from a frequency divider 106 to frequency and a phase of a clock pattern, which is received prior to a data array to be transmitted in order to extract a data rate of the data signal DIN, and outputs a control signal corresponding to such a comparison result.

The lock detector 104 compares the frequency and the phase of the feedback clock signal FBCLK to the frequency and the phase of the clock pattern of the data signal DIN. The lock detector 104 then determines whether or not the frequency and the phase of the feedback clock signal FBCLK approach the frequency and the phase of the clock pattern of the data signal DIN, respectively, to the extent of frequency that allows a loop containing the phase comparison circuit 102 to be locked, namely, whether the loop is locked or not. The lock detector 104 outputs a lock determination signal SEL as a logic signal, which indicates whether lock is detected (frequency entrainment operation is completed) or not, to each of multiplexers 107a and 107b. The lock determination signal SEL indicates locking in the case of logical "true".

The multiplexers 107a and 107b each receive the lock determination signal SEL, and thereupon each supply an output signal from the frequency phase comparison circuit 103 or an output signal from the phase comparison circuit 102 to a charge pump 108. The charge pump 108 receives a pulsed signal output from the frequency phase comparison circuit 103 or the phase comparison circuit 102, and thereupon outputs a pulsed current signal. The current signal is integrated by a loop filter 112 that is a low-pass filter configured of a resistance R109 and capacitors C110 and C111, and is thus converted into a voltage signal while unnecessary high-frequency components are removed, and is then received by the voltage control oscillator 105. The voltage control oscillator 105 oscillates a signal having a frequency corresponding to the received voltage signal. The clock signal VCOCLK output from the voltage control oscillator 105 is received by each of the phase comparison circuit 102 and the frequency divider 106.

The frequency divider 106 divides the clock signal VCOCLK into a frequency of 1/N (N is a natural number), and outputs such a divided signal as the feedback clock signal FBCLK. The feedback clock signal FBCLK is received by each of the frequency phase comparison circuit 103 and the lock detector 104.

The reproduction data signal RDATA output from the phase comparison circuit 102 and the clock signal VCOCLK output from the voltage control oscillator 105 are supplied to a subsequent deserializer 1310.

Figure 2:
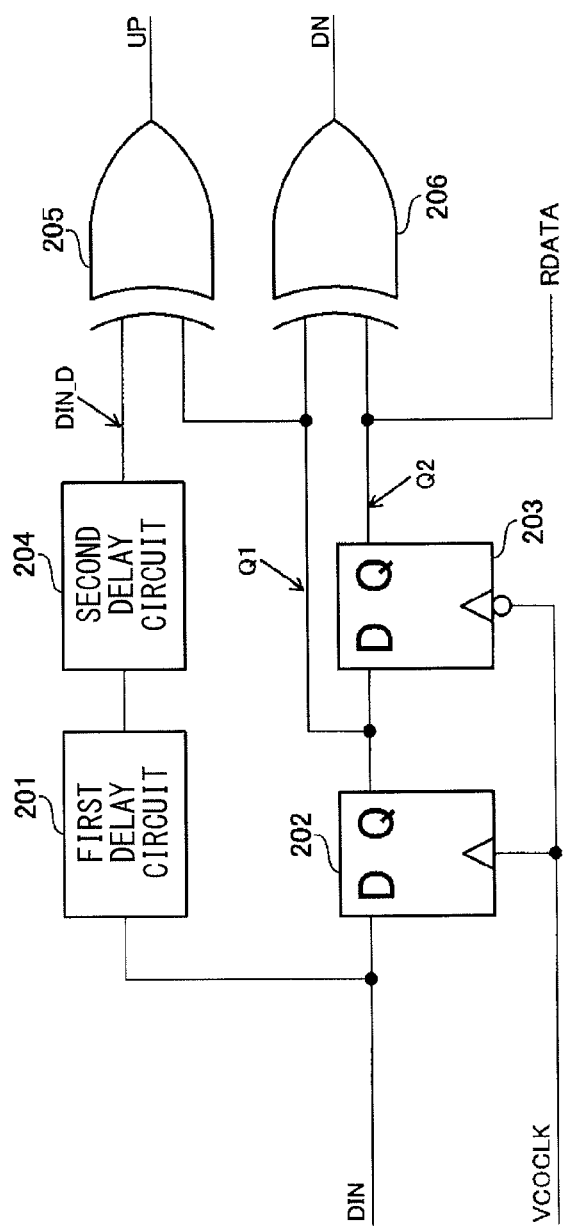
FIG. 2 is a circuit diagram of a phase comparison circuit.

FIG. 2 is a circuit diagram of the phase comparison circuit 102.

The data signal DIN is received by each of the first delay circuit 201 and the D terminal of the first DFF 202.

The clock signal VCOCLK is received by the clock terminal of the first DFF 202, and is also received by a clock terminal of the second DFF 203 while being inverted in logic.

An output signal from the first delay circuit 201 is supplied to the second delay circuit 204.

A signal Q1 as a Q output signal from the first DFF 202 and a delayed data signal DIN_D as an output signal from the second delay circuit 204 are received by a first EXOR 205. An output signal from the first EXOR 205 is a signal UP for phase advancement.

The signal Q1 and a signal Q2 as a Q output signal from the second DFF 203 are received by the second EXOR 206. An output signal form the second EXOR 206 is a signal DN for phase delay. The signal Q2 output from a Q terminal of the second DFF 203 is supplied as the reproduction data signal RDATA to the subsequent deserializer 1310 together with the clock signal VCOCLK.

The phase comparison circuit 102 illustrated in FIG. 1 is different from the phase comparison circuit 102 illustrated in FIG. 14 in that the second delay circuit 204 is cascade-connected to the first delay circuit 201. The first delay circuit 201 and the second delay circuit 204 in cascade connection delay the data signal DIN by delay time tDL12, and thus outputs the delayed data signal DIN_D.

The first delay circuit 201 and the second delay circuit 204 are each the same as a portion configuring the optimum shift time Tsh and the signal delay time td of the first DFF 202. The delay time tDL12 satisfies a relationship of tDL12=Tsh+td.

The delay time tDL12 is desirably equal to or longer than the sum of the signal delay time td and the setup time Ts and equal to or shorter than the sum of the setup time Ts and the holding time Th.

Operation of the phase comparison circuit 102 as an example embodiment of the disclosure illustrated in FIG. 2 is now described with reference to exemplary operation illustrated in FIG. 3.

Figure 3:
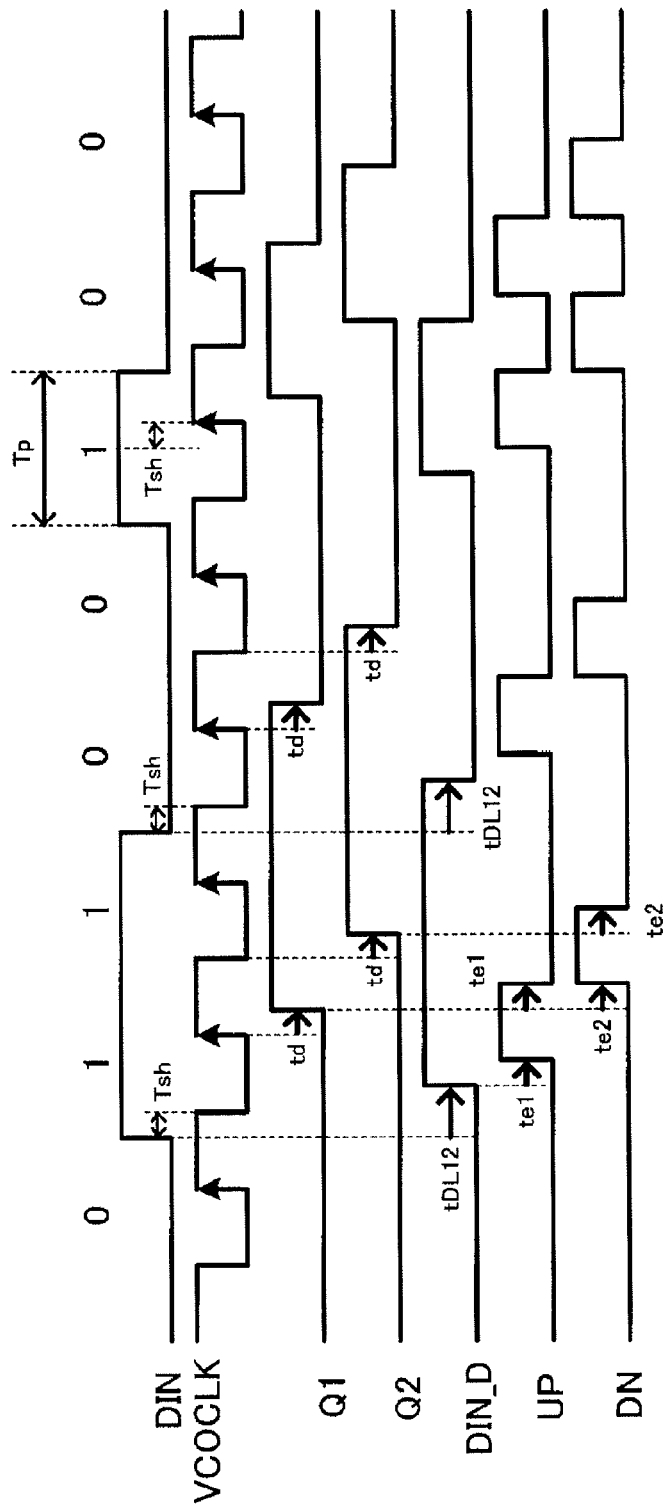
FIG. 3 is a timing chart of each of sections of the phase comparison circuit of the one embodiment of the disclosure.

FIG. 3 is a timing chart of each of sections of the phase comparison circuit 102 as an example embodiment of the disclosure. FIG. 3 illustrates timing of each signal in the case of a phasic relationship where a position of a rising edge of the clock signal VCOCLK is shifted by Tsh.

The delayed data signal DIN_D is a signal produced through delaying of the data signal DIN by delay time tDL12 due to the cascade connection of the first delay circuit 201 and the second delay circuit 204.

The signal Q1 is an output signal from the first DFF 202 that holds the data signal DIN at the rising edge of the clock signal VCOCLK, and then outputs the data signal DIN as the signal Q1. At this time, the first DFF 202 outputs the signal Q1 after the signal delay time td delay from the rising edge of clock input.

The signal Q2 is an output signal from the second DFF 203 that holds the signal Q1 at the falling edge of the clock signal VCOCLK, and then outputs the signal Q1 as the signal Q2. At this time, the second DFF 203 outputs the signal Q2 after a delay from the falling edge of clock input. In the case where the second DFF 203 is configured of the same flip-flop as that of the first DFF 202, the delay time from the falling edge of clock input to output of the signal Q2 is td.

The signal UP is an output signal from the first EXOR 205, and is also an output signal from the phase comparison circuit 102.

The signal DN is an output signal from the second EXOR 206, and is also an output signal from the phase comparison circuit 102.

The signal UP is an output from the first EXOR 205 that receives the delayed data signal DIN_D and the signal Q1, and is a pulse signal at an H level when the delayed data signal DIN_D and the signal Q1 have different values.

The signal DN is an output from the second EXOR 206 that receives the signal Q1 and the signal Q2, and is a pulse signal at an H level when the signal Q1 and the signal Q2 have different values.

As can be seen from the exemplary operation illustrated in FIG. 3, the pulse width of the signal DN is constantly Tp/2. On the other hand, in the case of a phasic relationship where a phase difference between the data signal DIN and the clock signal VCOCLK is as illustrated in FIG. 3, the pulse width Tup of the signal UP is represented by the following formula.

$$Tup=Tp/2+Tsh+(td-tDL12)$$

The PLL configuring the CDR is locked in a phasic relationship where the pulse width of the signal UP is equal to the pulse width of the signal DN. Hence, for locking of the PLL in a phasic relationship where a position of the rising edge of the clock signal VCOCLK is shifted by a time of Tsh as illustrated in FIG. 3, the delay time tDL12 is necessary to have a value that allows a relationship of Tsh+(td−tDL12)=0 to be established. In other words, tDL12=Tsh+td is necessary to be established. The delay time tDL12 is a delay time caused by the cascade connection of the first delay circuit 201 and the second delay circuit 204. Thus, the above relationship is exemplarily achieved by setting one of delay time of the first delay circuit 201 and delay time of the second delay circuit 204 to be the optimum shift time Tsh of the first DFF 202, and setting the other to be the delay time td thereof.

In this way, as illustrated in FIG. 3, the phase comparison circuit 102 as an example embodiment of the disclosure allows the PLL to be locked in the phasic relationship where the position of the rising edge of the clock signal VCOCLK is shifted by the optimum shift time Tsh.

First Embodiment

Figure 4:
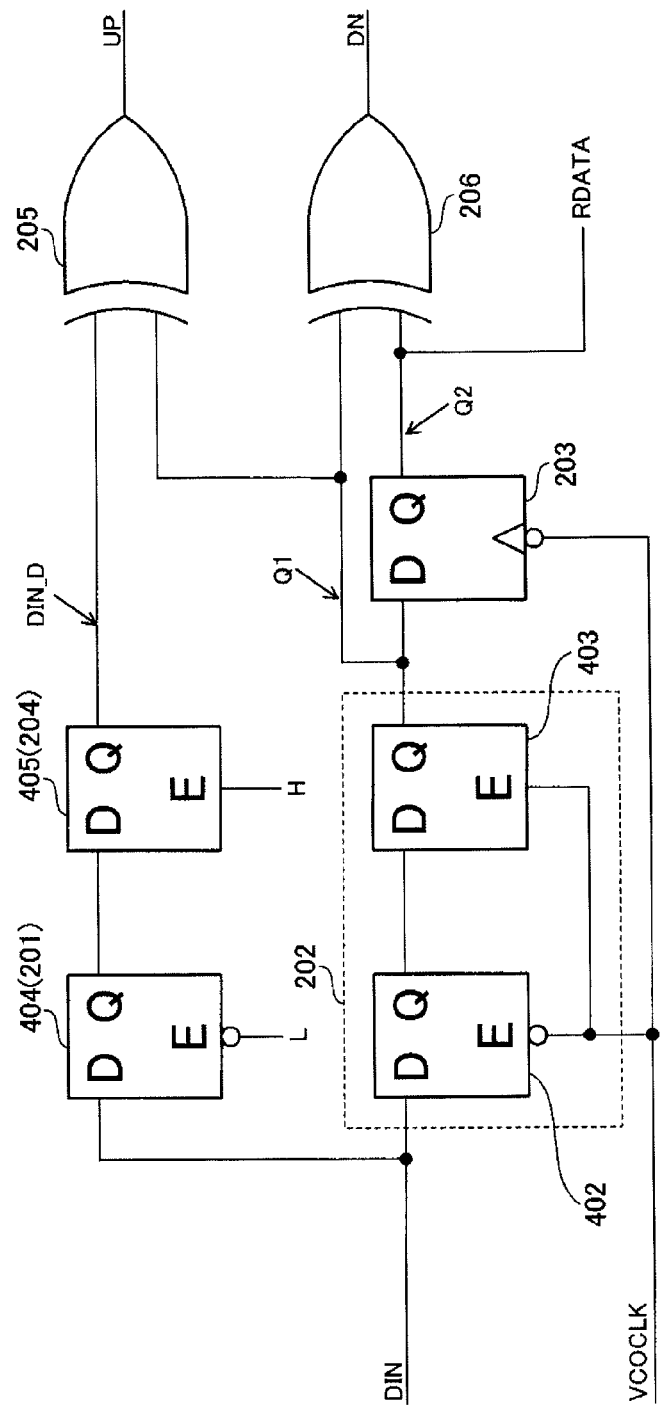
FIG. 4 is a circuit diagram of a phase comparison circuit according to a first embodiment of the disclosure.

Phase Comparison Circuit 401 Including Delay Circuit Having Circuit Configuration Equal to Circuit Configuration of D Flip-Flop FIG. 4 is a circuit diagram of a phase comparison circuit 401 according to a first embodiment of the disclosure.

The first DFF 202, which is a falling-edge-triggered D flip-flop, is of a master/slave type configured of a combination of a first D latch 402 as a master latch and a second D latch 403 as a slave latch.

The output terminal of the first D latch 402 is connected to the D terminal of the second D latch 403. The E input of the first D latch 402 receives an inverted clock signal VCOCLK, while the E input of the second D latch 403 receives the clock signal VCOCLK.

The optimum shift time of the D flip-flop, which often corresponds to the setup time of the D flip-flop, is time necessary for the first D latch 402 as the master latch to maintain a logical state of a data input terminal D. The optimum shift time is therefore equal to delay time from the D terminal to the Q terminal when the E input is made logical "true" so as to be in an enable state.

The signal delay time of the D flip-flop often corresponds to delay time from a rising edge of the E input of the second D latch 403 as the slave latch to output through the Q terminal thereof. The signal delay time is therefore substantially equal to delay time from the D terminal to the Q terminal when the E input is made logical "false" so as to be in an enable state.

Thus, the delay time of the first D latch 402 is set to the optimum shift time Tsh of the first DFF 202. In addition, the delay time of the second D latch 403 is set to output delay time td of the second DFF 203. To achieve such setting, a third D latch 404 is disposed as the first delay circuit 201 and a fourth D latch 405 is disposed as the second delay circuit 204.

The third D latch 404 includes the same circuit as that of the first D latch 402, and the E input thereof is fixed to logical "false" so as to be in an enable state (unlatched state). The fourth D latch 405 includes the same circuit as that of the second D latch 403, and the E input thereof is fixed to logical "true" so as to be in an enable state.

In this way, a D latch having the same configuration as that of the D latch configuring the first DFF 202 is disposed as each of the first delay circuit 201 and the second delay circuit 204, and the E input of the D latch is fixed to an appropriate logical value, thereby making it possible to achieve the phase comparison circuit 401 according to the first embodiment of the disclosure.

The D latch having the same configuration as that of the D latch configuring the first DFF 202 is disposed as each of the first delay circuit 201 and the second delay circuit 204. In other words, the logical step number of a gate circuit configuring the first DFF 202 is equal to the logical step number of a gate circuit configuring each of the first delay circuit 201 and the second delay circuit 204. It is to be noted that the logical step number of the gate circuit configuring each of the first delay circuit 201 and the second delay circuit 204 may be larger than that in the first DFF 202 for convenience of integrated-circuit design.

[Variations of First DFF and Delay Circuit]

Variations of the first DFF and the delay circuit are now described with reference to FIGS. 5A to 9.

[First Exemplary Circuit]

Figure 5A:
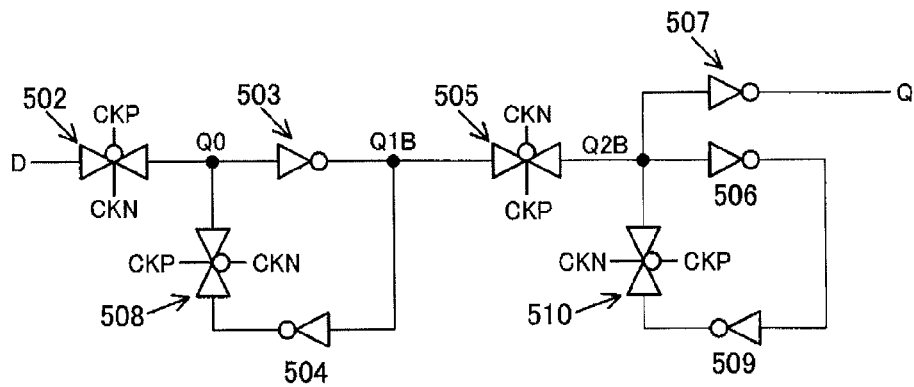
FIGS. 5A and 5B illustrate first exemplary circuits of first DFF 202 and a first delay circuit 201 as well as a second delay circuit 204, respectively.
Figure 5B:
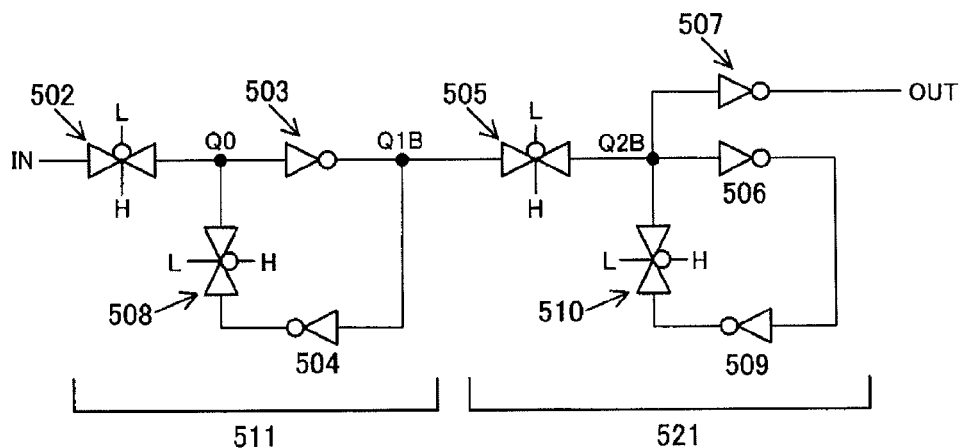

FIGS. 5A and 5B illustrate first exemplary circuits of the first DFF and a first delay circuit as well as a second delay circuit, respectively.

FIG. 5A is a circuit diagram of a first DFF 501.

The D terminal of the first DFF 501 is connected to a first transfer gate 502. The first transfer gate 502 is also referred to as MOS switch. The first transfer gate 502 is ON while a state of its clock terminal is logical "false". In FIGS. 5A and 5B, "CKP" represents a clock terminal that is not inverted in logic, and "CKN" represents a clock terminal that is inverted in logic. The same holds true for FIGS. 6A and 6B and FIG. 7 described later.

The first transfer gate 502 is connected to a first NOT gate 503.

The first NOT gate 503 is connected to a second NOT gate 504 and a second transfer gate 505. The second transfer gate 505 is ON while its clock terminal is logical "true".

The second transfer gate 505 is connected to a third NOT gate 506 and a fifth NOT gate 507. The output terminal of the fifth NOT gate 507 acts as the Q output terminal of the first DFF 501.

The second NOT gate 504 is connected to a third transfer gate 508. The third transfer gate 508 is ON while its clock terminal is logical "true".

The third transfer gate 508 is connected to the first transfer gate 502 and the first NOT gate 503.

The third NOT gate 506 is connected to a fourth NOT gate 509.

The fourth NOT gate 509 is connected to a fourth transfer gate 510. The fourth transfer gate 510 is ON while its clock terminal is logical "false".

The fourth transfer gate 510 is connected to the second transfer gate 505, the third NOT gate 506, and the fifth NOT gate 507.

FIG. 5B illustrates a circuit diagram of each of the first delay circuit 511 and the second delay circuit 521. The circuit of FIG. 5B is the same as the circuit of the first DFF 501 illustrated in FIG. 5A except that the first transfer gate 502 and the second transfer gate 505 are each constantly ON, while the third transfer gate 508 and the fourth transfer gate 510 are each constantly OFF. Specifically, the first transfer gate 502 and the second transfer gate 505 are each set to a constantly ON state, and the third transfer gate 508 and the fourth transfer gate 510 are each set to a constantly OFF state such that both the master latch and the slave latch configuring the D flip-flop are in an enable state.

The second NOT gate 504, the third NOT gate 506, the fourth NOT gate 509, the third transfer gate 508, and the fourth transfer gate 510 are still provided though each of such gates does not substantially function as a logic circuit. One purpose for this is to adjust electric characteristics of each of the first delay circuit 511 and the second delay circuit 521 to be equal to electric characteristics of the circuits of the first DFF 501. Through such adjustment of the electric characteristics, respective delay time periods of the first and second delay circuits are promisingly adjusted to be equal to the optimum shift time Tsh and the output delay time td of the first DFF 501 regardless of fabrication variations and operation environment such as voltage and temperature despite no adjustment.

[Second Exemplary Circuit]

Figure 6A:
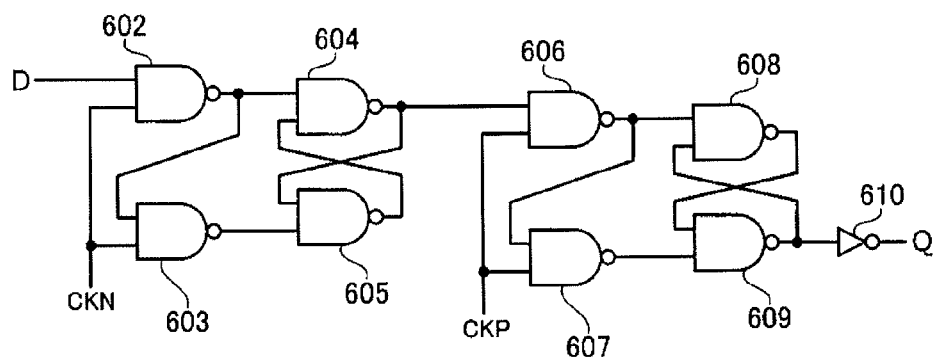
FIGS. 6A and 6B illustrate second exemplary circuits of the first DFF 202 and the first delay circuit 201 as well as the second delay circuit 204, respectively.
Figure 6B:
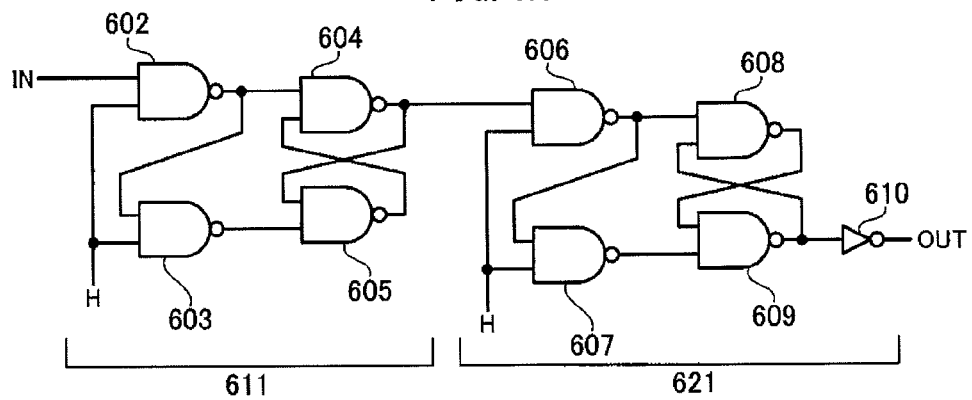

FIGS. 6A and 6B illustrate second exemplary circuits of the first DFF and the first delay circuit as well as the second delay circuit, respectively.

FIG. 6A is a circuit diagram of a first DFF 601. The first DFF 601 is configured of NAND gates.

The D terminal of the first DFF 601 is connected to a first input terminal of the first NAND gate 602.

The output terminal of the first NAND gate 602 is connected to a first input terminal of the second NAND gate 603 and a first input terminal of the third NAND gate 604. The clock terminal CKN being inverted in logic of the first DFF 601 is connected to a second input terminal of the first NAND gate 602 and a second input terminal of the second NAND gate 603.

The output terminal of the third NAND gate 604 is connected to a first input terminal of the fourth NAND gate 605 and a first input terminal of the fifth NAND gate 606. A second input terminal of the fourth NAND gate 605 is connected to the output terminal of the second NAND gate 603. A second input terminal of the third NAND gate 604 is connected to the output terminal of the fourth NAND gate 605.

The first NAND gate 602, the second NAND gate 603, the third NAND gate 604, and the fourth NAND gate 605 configure a master latch.

The output terminal of the fifth NAND gate 606 is connected to a first input terminal of the sixth NAND gate 607 and a first input terminal of the seventh NAND gate 608. The clock terminal CKP being not inverted in logic of the first DFF 601 is connected to a second input terminal of the fifth NAND gate 606 and a second input terminal of the sixth NAND gate 607.

The output terminal of the seventh NAND gate 608 is connected to a first input terminal of the eighth NAND gate 609. A second input terminal of the eighth NAND gate 609 is connected to the output terminal of the sixth NAND gate 607. A second input terminal of the seventh NAND gate 608 is connected to the output terminal of the eighth NAND gate 609.

The output terminal of the eighth NAND gate 609 is connected to a NOT gate 610 of which the output terminal is connected to the Q terminal of the first DFF 601.

The fifth NAND gate 606, the sixth NAND gate 607, the seventh NAND gate 608, the eighth NAND gate 609, and the NOT gate 610 configure a slave latch.

FIG. 6B is a circuit diagram of the first delay circuit 611 as well as the second delay circuit 621. The circuit of FIG. 6B has the same configuration as that of the circuit of FIG. 6A except that logical "true" (H) is constantly given, instead of supplying a clock signal, to the clock terminal CKN being inverted in logic for signal supply to the first NAND gate 602 and the second NAND gate 603. Similarly, logical "true" (H) is constantly given, instead of supplying a clock signal, to the clock terminal CKP being not inverted in logic for signal supply to the fifth NAND gate 606 and the sixth NAND gate 607. In other words, logic corresponding to the clock signal is constantly set to "true" such that both the master latch and the slave latch configuring the D flip-flop are in an enable state.

[Third Exemplary Circuit]

Figure 7:
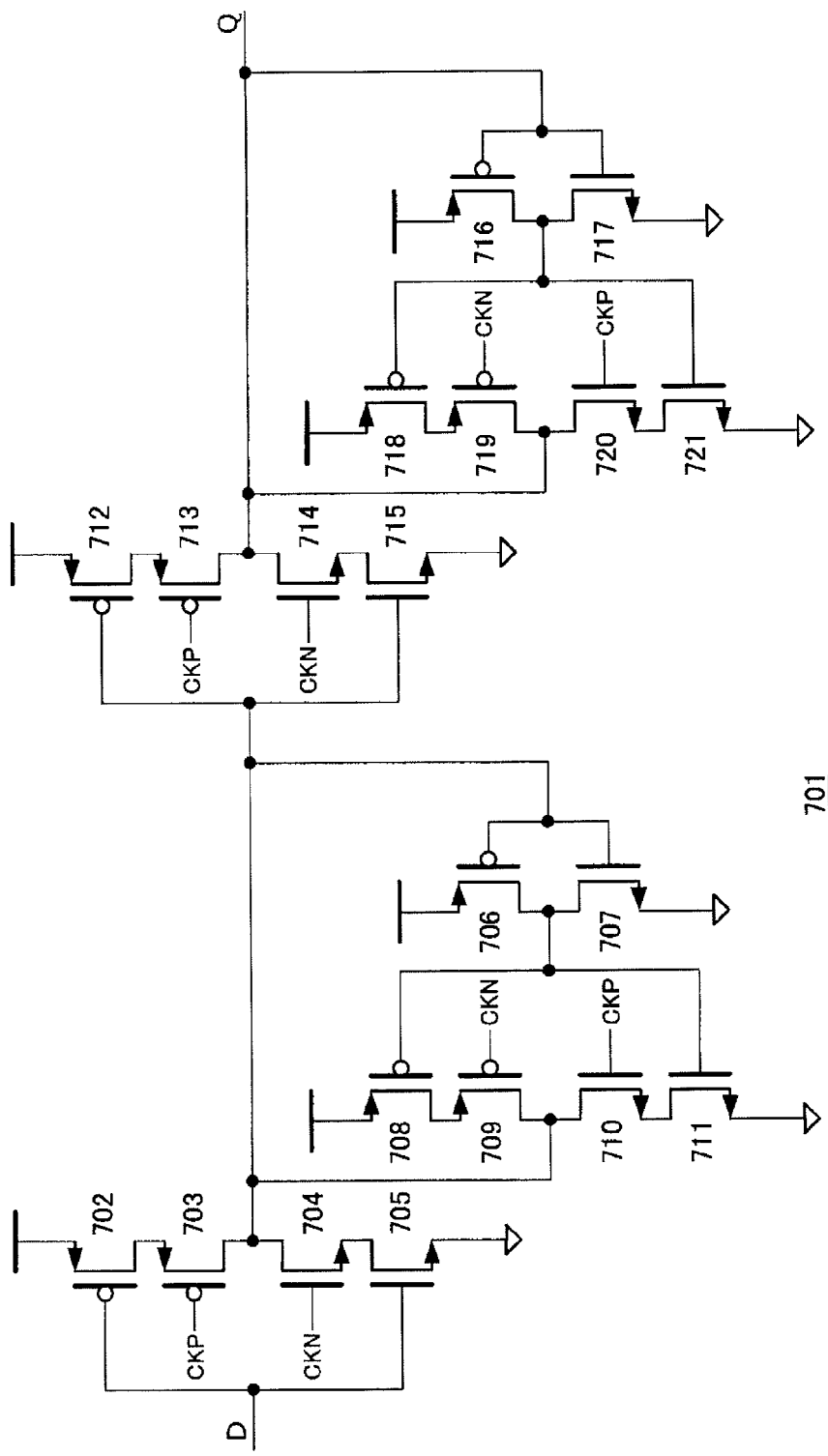
FIG. 7 illustrates a third exemplary circuit of the first DFF 202.
Figure 8:
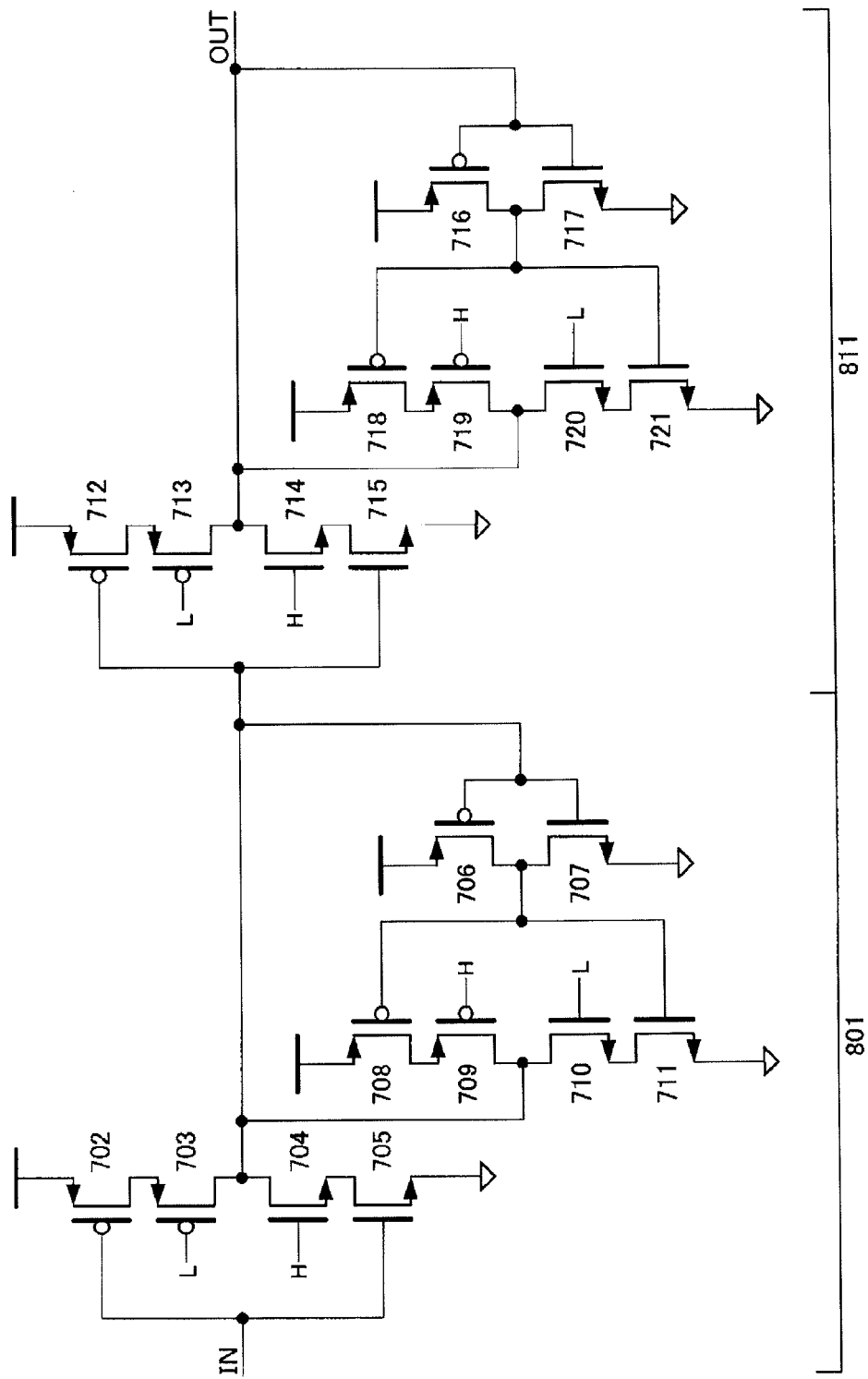
FIG. 8 illustrates a third exemplary circuit of each of the first delay circuit 201 and the second delay circuit 204.

FIGS. 7 and 8 illustrate third exemplary circuits of the first DFF and the first delay circuit as well as the second delay circuit, respectively.

FIG. 7 is a circuit diagram of a first DFF 701.

The source of a first P channel MOSFET (hereinafter, "P channel MOSFET" is abbreviated as "PMOSFET", and "N channel MOSFET" is abbreviated as "NMOSFET") 702 is connected to a power supply node.

The drain of the first PMOSFET 702 is connected to the source of a second PMOSFET 703.

The drain of the second PMOSFET 703 is connected to the drain of a third NMOSFET 704.

The source of the third NMOSFET 704 is connected to the drain of a fourth NMOSFET 705.

The source of the fourth NMOSFET 705 is connected to a ground node.

The gate of the first PMOSFET 702 and the gate of the fourth NMOSFET 705 are connected to each other to form a D terminal.

The gate of the second PMOSFET 703 acts as a clock terminal CKN being inverted in logic.

The gate of the third NMOSFET 704 acts as a clock terminal CKP being not inverted in logic.

The first PMOSFET 702, the second PMOSFET 703, the third NMOSFET 704, and the fourth NMOSFET 705 configure a transfer gate containing a NOT gate. The drain of the second PMOSFET 703 and the drain of the third NMOSFET 704 form an output terminal of the transfer gate.

The drains of the second PMOSFET 703 and the third NMOSFET 704 are connected to the gates of the fifth PMOSFET 706 and the sixth NMOSFET 707.

The source of the fifth PMOSFET 706 is connected to the power supply node. The drain of the fifth PMOSFET 706 is connected to the source of the sixth PMOSFET. The source of the sixth NMOSFET 707 is connected to the ground node.

The fifth PMOSFET 706 and the sixth NMOSFET 707 configure a NOT node. The drain of the fifth PMOSFET 706 and the drain of the sixth NMOSFET 707 form an output terminal of the NOT gate.

A seventh PMOSFET 708, an eighth PMOSFET 709, a ninth NMOSFET 710, and a tenth NMOSFET 711 configure a transfer gate containing a NOT gate as with the first PMOSFET 702, the second PMOSFET 703, the third NMOSFET 704, and the fourth NMOSFET 705.

The seventh PMOSFET 708, the eighth PMOSFET 709, the ninth NMOSFET 710, and the tenth NMOSFET 711 correspond to the first PMOSFET 702, the second PMOSFET 703, the third NMOSFET 704, and the fourth NMOSFET 705, respectively.

Both the gates of the seventh PMOSFET 708 and the tenth NMOSFET 711 are connected to the drains of the fifth PMOSFET 706 and the sixth NMOSFET 707.

The gate of the eighth PMOSFET 709 acts as a clock terminal CKP being not inverted in logic.

The gate of the ninth NMOSFET 710 acts as a clock terminal CKN being inverted in logic.

The drains of the eighth PMOSFET 709 and the ninth NMOSFET 710 are connected to the drains of the second PMOSFET 703 and the third NMOSFET 704.

An eleventh PMOSFET 712, a twelfth PMOSFET 713, a thirteenth NMOSFET 714, and a fourteenth NMOSFET 715 configure a transfer gate containing a NOT gate as with the first PMOSFET 702, the second PMOSFET 703, the third NMOSFET 704, and the fourth NMOSFET 705.

The eleventh PMOSFET 712, the twelfth PMOSFET 713, the thirteenth NMOSFET 714, and the fourteenth NMOSFET 715 correspond to the first PMOSFET 702, the second PMOSFET 703, the third NMOSFET 704, and the fourth NMOSFET 705, respectively.

Both the gates of the eleventh PMOSFET 712 and the fourteenth NMOSFET 715 are connected to the drains of the second PMOSFET 703 and the third NMOSFET 704.

The gate of the twelfth PMOSFET 713 acts as a clock terminal CKN being inverted in logic.

The gate of the thirteenth NMOSFET 714 acts as a clock terminal CKP being not inverted in logic.

A fifteenth PMOSFET 716 and a sixteenth NMOSFET 717 configure a NOT node as with the fifth PMOSFET 706 and the sixth NMOSFET 707. The drain of the fifteenth PMOSFET 716 and the drain of the sixteenth NMOSFET 717 form an output terminal of the NOT gate.

The drains of the twelfth PMOSFET 713 and the thirteenth NMOSFET 714 are connected to the gates of the fifteenth PMOSFET 716 and the sixteenth NMOSFET 717.

A seventeenth PMOSFET 718, an eighteenth PMOSFET 719, a nineteenth NMOSFET 720, and a twentieth NMOSFET 721 configure a transfer gate containing a NOT gate as with the first PMOSFET 702, the second PMOSFET 703, the third NMOSFET 704, and the fourth NMOSFET 705.

The seventeenth PMOSFET 718, the eighteenth PMOSFET 719, the nineteenth NMOSFET 720, and the twentieth NMOSFET 721 correspond to the first PMOSFET 702, the second PMOSFET 703, the third NMOSFET 704, and the fourth NMOSFET 705, respectively.

Both the gates of the seventeenth PMOSFET 718 and the twentieth NMOSFET 721 are connected to the drains of the fifteenth PMOSFET 716 and the sixteenth NMOSFET 717.

The gate of the eighteenth PMOSFET 719 acts as a clock terminal CKP being not inverted in logic.

The gate of the nineteenth NMOSFET 720 acts as a clock terminal CKN being inverted in logic.

The drains of the eighteenth PMOSFET 719 and the nineteenth NMOSFET 720 are connected to the drains of the twelfth PMOSFET 713 and the thirteenth NMOSFET 714.

The drain of the twelfth PMOSFET 713 and the drain of the thirteenth NMOSFET 714 form a Q terminal of the first DFF 701.

FIG. 8 is a circuit diagram of a first delay circuit 801 and a second delay circuit 811. The circuit of FIG. 8 has the same configuration as that of the circuit of FIG. 7 except that logical "false" (L) is constantly given to each of the gates of the second PMOSFET 703, the ninth NMOSFET 710, the twelfth PMOSFET 713, and the nineteenth NMOSFET 720, while logical "true" (H) is constantly given to each of the gates of the third NMOSFET 704, the eighth PMOSFET 709, the thirteenth NMOSFET 714, and the eighteenth PMOSFET 719.

Specifically, as with the first exemplary circuit illustrated in FIG. 5B, the first PMOSFET 702, the second PMOSFET 703, the third NMOSFET 704, and the fourth NMOSFET 705, which in all substantially correspond to the first transfer gate 502 in FIG. 5B, are each set to an constantly ON state. In addition, the eleventh PMOSFET 712, the twelfth PMOSFET 713, the thirteenth NMOSFET 714, and the fourteenth NMOSFET 715, which in all substantially correspond to the second transfer gate 505 in FIG. 5B, are each set to a constantly ON state. In addition, the seventh PMOSFET 708, the eighth PMOSFET 709, the ninth NMOSFET 710, and the tenth NMOSFET 711, which in all substantially correspond to the third transfer gate 508 in FIG. 5B, are each set to a constantly OFF state. Furthermore, the seventeenth PMOSFET 718, the eighteenth PMOSFET 719, the nineteenth NMOSFET 720, and the twentieth NMOSFET 721, which in all substantially correspond to the fourth transfer gate 510 in FIG. 5B, are each set to a constantly OFF state.

[Fourth Exemplary Circuit]

Figure 9:
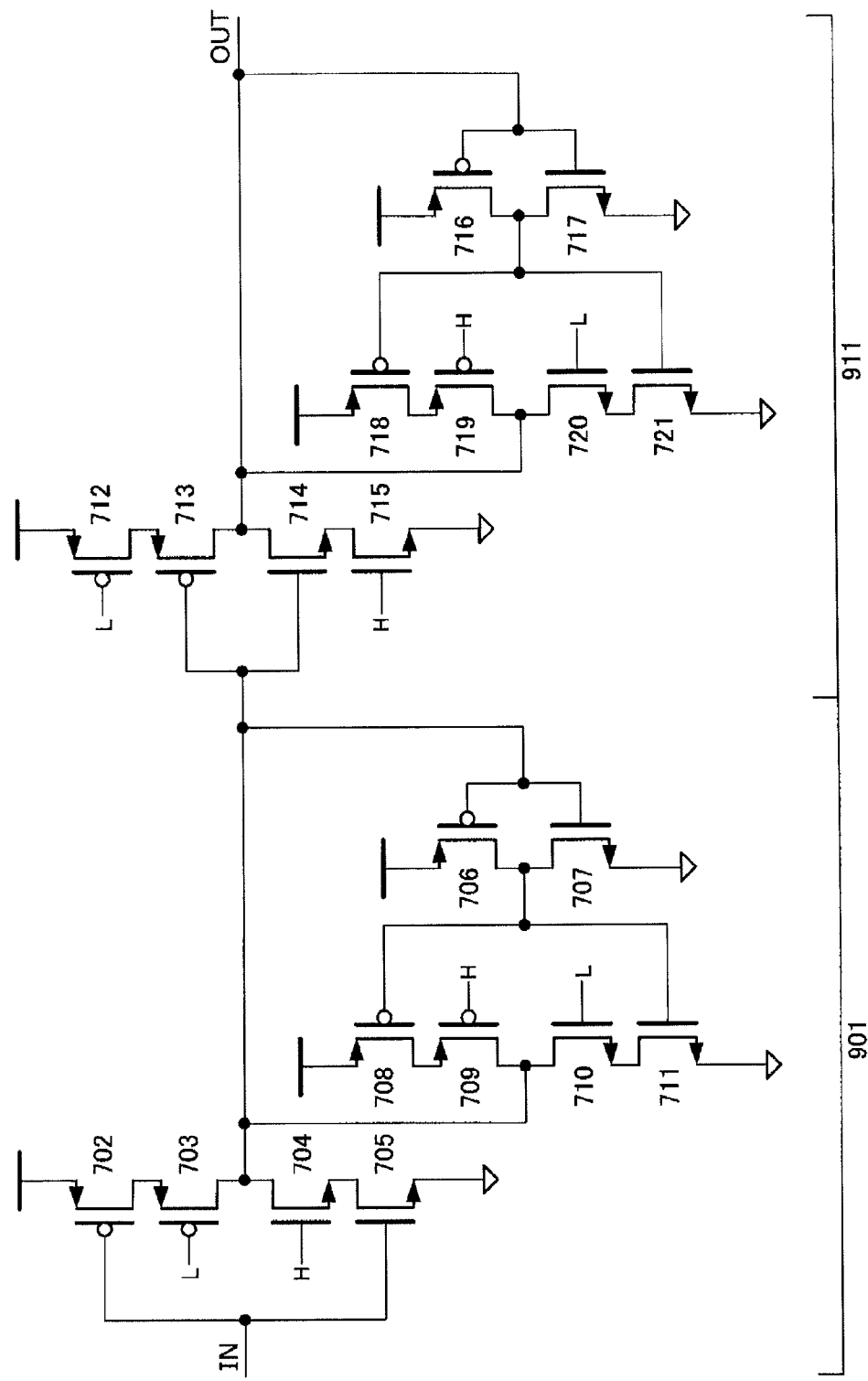
FIG. 9 illustrates a fourth exemplary circuit of each of the first delay circuit 201 and the second delay circuit 204.

FIG. 9 illustrates a fourth exemplary circuit of each of a first delay circuit 901 and a second delay circuit 911. The circuit of FIG. 9 is different from the circuit of FIG. 8 in that the drains of the second PMOSFET 703 and the third NMOSFET 704 are connected to the gates of the twelfth PMOSFET 713 and the thirteenth NMOSFET 714, and logical "false" is constantly given to the gate of the eleventh PMOSFET 712 while logical "true" is constantly given to the gate of the fourteenth NMOSFET 715.

The second delay circuit 911 in the circuit of FIG. 9 is configured such that an output signal from the master latch of the first DFF 701 illustrated in FIG. 7 corresponds to the E input of the slave latch thereof, and the eleventh PMOSFET 712 and the fourteenth NMOSFET 715 are each constantly ON. Consequently, the delay time from the rising edge of clock input to output of the signal Q1 in the first DFF 701 is more accurately achieved as delay time of the second delay circuit 911.

Second Embodiment

CDR 1001 Including Variable Delay Circuit and Delay Amount Control Section, and Phase Comparison Circuit 1002

The first embodiment has been described with the phase comparison circuit 401 that achieves a desired delay time without adjustment. In contrast, a variable delay circuit may be used to appropriately control a delay amount, thereby making it possible to achieve a phase comparison circuit 1002 that allows a clock margin to be maximized.

Figure 10A:
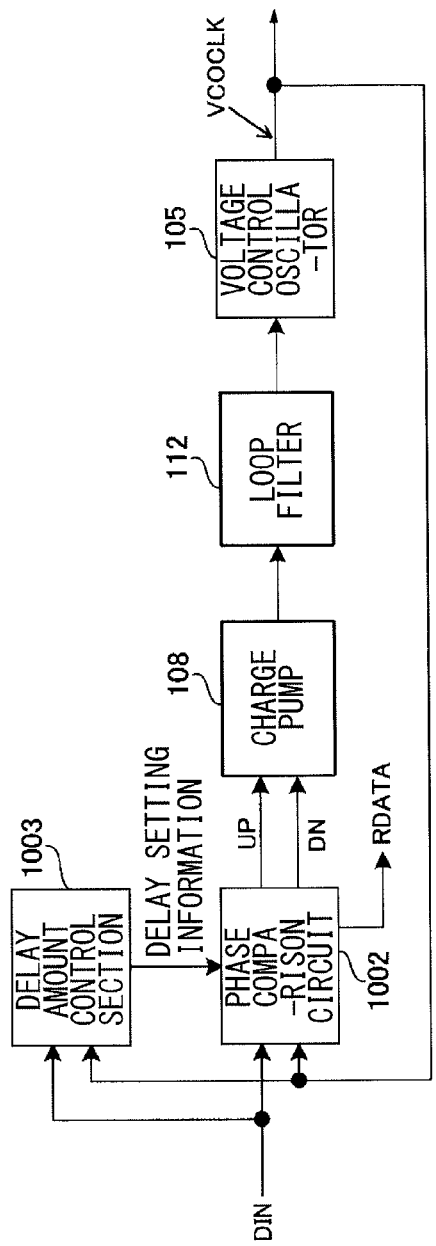
FIGS. 10A and 10B are a block diagram of CDR and a circuit diagram of a phase comparison circuit, respectively, according to a second embodiment of the disclosure.
Figure 10B:
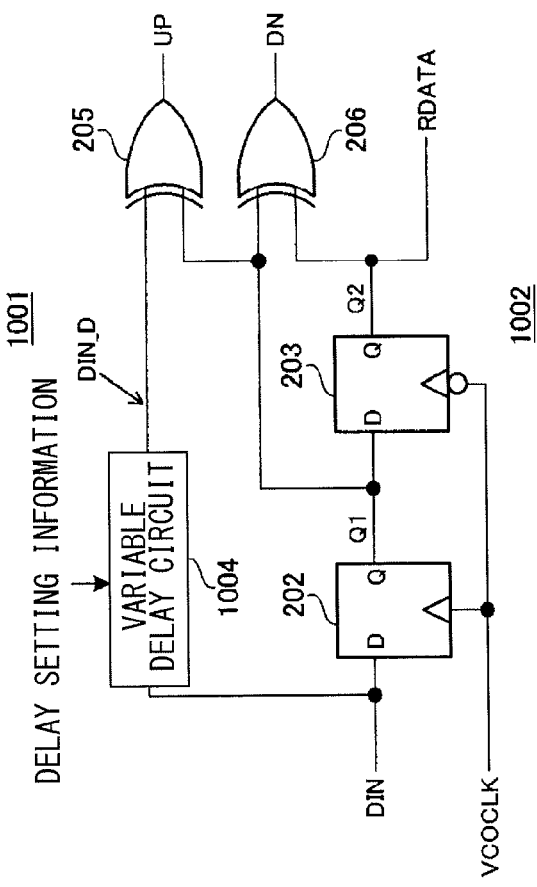

FIGS. 10A and 10B are a block diagram of CDR 1001 and a circuit diagram of a phase comparison circuit 1002, respectively, according to a second embodiment.

FIG. 10A is a block diagram of the CDR 1001. To simplify illustration, the frequency phase comparison circuit 103, the frequency divider 106, the lock detector 104, and the multiplexers 107a and 107b are omitted.

The data signal DIN is received by each of the phase comparison circuit 1002 and a delay amount control section 1003. The delay amount control section 1003 also receives a clock signal VCOCLK output from the voltage control oscillator 105. The delay amount control section 1003 outputs delay setting information to the phase comparison circuit 1002.

FIG. 10B is a circuit diagram of the phase comparison circuit 1002 in the CDR 1001. The phase comparison circuit 1002 has a configuration in which the first delay circuit 201 and the second delay circuit 204 of the phase comparison circuit 102 of FIG. 2 are replaced with a variable delay circuit 1004.

The variable delay circuit 1004 receives the delay setting information output from the delay amount control section 1003, and thereupon sets a predetermined delay time. The delay amount control section 1003 outputs the delay setting information such that the variable delay time VTDL set by the variable delay circuit 1004 satisfies the relationship VTDL=Tsh+td.

Figure 11:
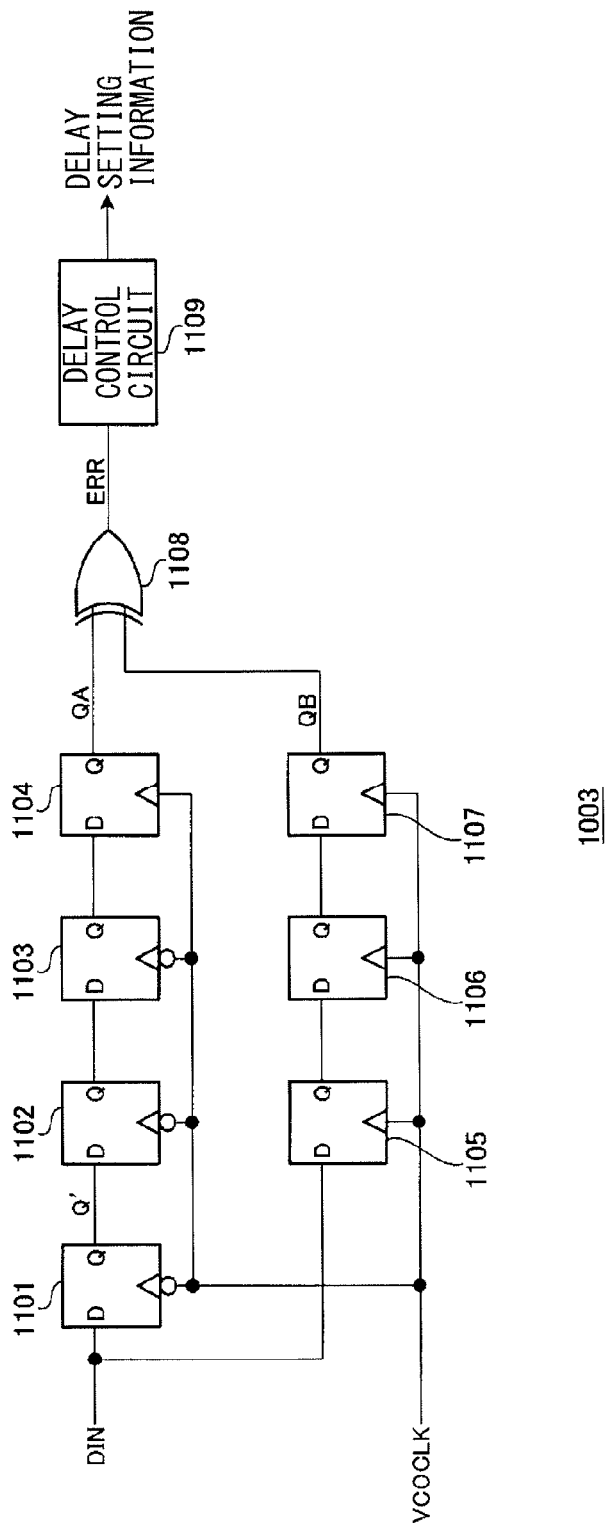
FIG. 11 is a circuit diagram of a delay amount control section 1003.

FIG. 11 is a circuit diagram of the delay amount control section 1003.

The data signal DIN is received by the D terminal of a third DFF 1101. The Q output terminal of the third DFF 1101 is connected to the D terminal of a fourth DFF 1102. The Q output terminal of the fourth DFF 1102 is connected to the D terminal of a fifth DFF 1103. The Q output terminal of the fifth DFF 1103 is connected to the D terminal of a sixth DFF 1104.

The data signal DIN is also received by the D terminal of a seventh DFF 1105. The Q output terminal of the seventh DFF 1105 is connected to the D terminal of an eighth DFF 1106. The Q output terminal of the eighth DFF 1106 is connected to the D terminal of a ninth DFF 1107.

Each of the clock terminals of the third DFF 1101, the fourth DFF 1102, and the fifth DFF 1103 receives a signal ¬ VCOCLK ("¬" represents logical NOT) produced by inverting logic of the clock signal VCOCLK.

Each of the clock terminals of the sixth DFF 1104, the seventh DFF 1105, the eighth DFF 1106, and the ninth DFF 1107 receives the clock signal VCOCLK being not inverted in logic.

The respective Q output terminals of the sixth DFF 1104 and the ninth DFF 1107 are connected to input terminals of a third EXOR 1108.

The output terminal of the third EXOR 1108 is connected to a delay control circuit 1109.

Any of the third DFF 1101, the fourth DFF 1102, the fifth DFF 1103, the sixth DFF 1104, the seventh DFF 1105, the eighth DFF 1106, and the ninth DFF 1107 has the same circuit configuration as that of the first DFF 701 of FIG. 7.

Figure 12A:
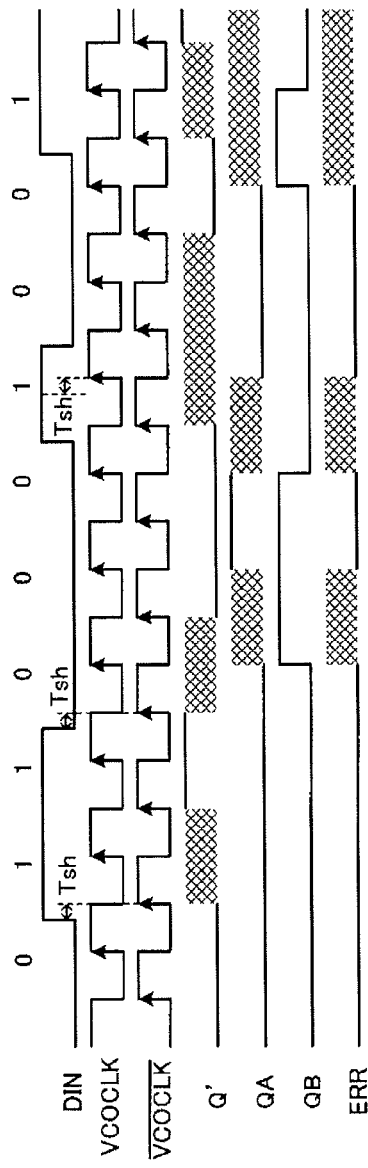
FIGS. 12A and 12B are each a timing chart of each section of the delay amount control section 1003.
Figure 12B:
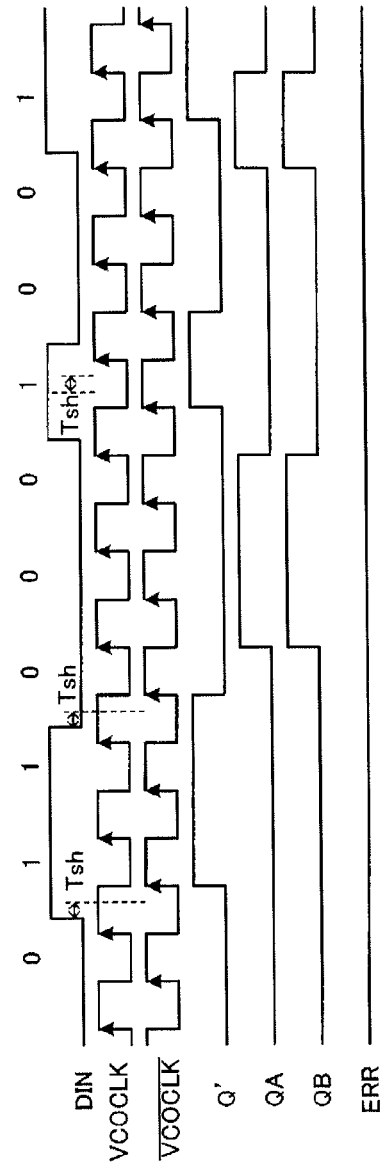

FIGS. 12A and 12B are each a timing chart of each section of the delay amount control section 1003.

Each of the clock terminals of the third DFF 1101, the fourth DFF 1102, and the fifth DFF 1103 receives the signal ¬ VCOCLK produced by inverting logic of the clock signal VCOCLK. In other words, the input signal is stored at a falling edge of the clock signal VCOCLK.

First, the delay control circuit 1109 sets the delay time of the variable delay circuit 1004 to be longer than assumed optimum shift time Tsh. A predetermined data signal to be processed by the CDR 1001 is supplied as the data signal DIN. If the delay time is longer than the optimum shift time Tsh of each of the first DFF 701 and the third DFF 1101, as illustrated in FIG. 12B, an up edge of the signal ¬ VCOCLK produced by inverting logic of the clock signal VCOCLK is delayed from the optimum shift time Tsh, and therefore the third DFF 1101 outputs a stable output signal Q'. Similarly, since the fourth DFF 1102 and the fifth DFF 1103 each also output a stable output signal, the logic of an output signal QA from the sixth DFF 1104 corresponds to the logic of an output signal QB from the ninth DFF 1107. Hence, the output ERR from the third EXOR 1108 is maintained to be logical "false".

Subsequently, the delay control circuit 1109 gradually decreases the delay time of the variable delay circuit 1004. If the delay time of the variable delay circuit 1004 is shorter than the optimum shift time Tsh of each of the first DFF 701 and the third DFF 1101, as illustrated in FIG. 12A, the up edge of the signal ¬ VCOCLK produced by inverting logic of the clock signal VCOCLK is within a range of the optimum shift time Tsh, and therefore the third DFF 1101 induces a metastable state (each shaded portion in FIG. 12A) that causes output voltage of the output signal Q' to be unstable. As a result, output from each of the fourth DFF 1102 and the fifth DFF 1103 is uncertain (although one of an L level and an H level is output, which level is output is unspecified), and therefore the logic of the output signal QA from the sixth DFF 1104 may not correspond to the logic of the output signal QB from the ninth DFF 1107. As a result, logical "true" may appear in an output ERR from the third EXOR 1108.

The delay control circuit 1109 sets the delay time of the variable delay circuit 1004 under the setting where logical "true" appears in the signal ERR.

Three D flip-flops each having a clock terminal that receives the signal ¬ VCOCLK produced by inverting logic of the clock signal VCOCLK, i.e., the third DFF 1101, the fourth DFF 1102, and the fifth DFF 1103 are provided. One reason for this is to prevent a metastable state of the signal QA to be received by the third EXOR 1108 even if the third DFF 1101 is metastable. Such a metastable state causes an unstable state of a circuit, which may further cause false operation of each of the third EXOR 1108 and the delay control circuit 1109. Thus, the signal QA to be received by the third EXOR 1108 is fixed to one of the L and H levels, thereby avoiding false operation of each of the third EXOR 1108 and the delay control circuit 1109.

Third Embodiment

Overall Configuration of Data Transmission/Reception System

Figure 13:
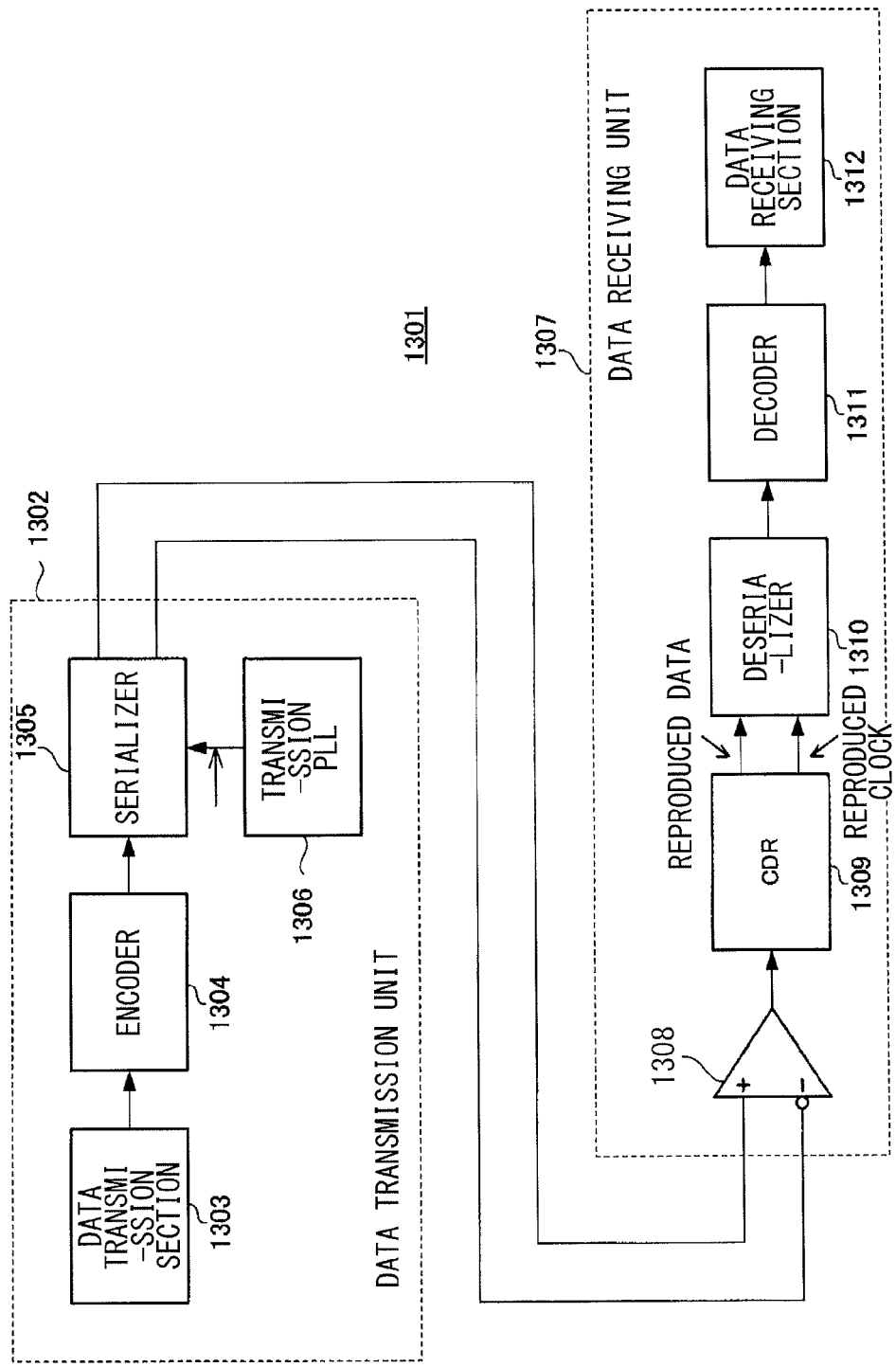
FIG. 13 is a block diagram of a data transmission/reception system according to a third embodiment of the disclosure.

FIG. 13 is a block diagram of a data transmission/reception system 1301 according to a third embodiment of the present disclosure.

A data transmission unit 1302 includes a data transmission section 1303, an encoder 1304, a serializer 1305, and a transmission PLL 1306.

The data transmission section 1303 generates transmission data that is then supplied to the encoder 1304. The encoder 1304 encodes the data sent from the data transmission section 1303 in an encoding method where "0" or "1" is continued within a definite number of bits. Examples of the encoding method may include 8b/10b, 64b/66b, EFM, (1, 7) modulation, etc.

The modulated data output from the encoder 1304 is subjected to parallel-to-serial conversion by the serializer 1305. At this time, the serializer 1305 uses a transmission clock output from the transmission PLL 1306 to dispose the clock and the modulated data on a time series in accordance with a predetermined bit format, and thus outputs a data signal containing the clock.

The data signal output from the data transmission unit 1302 is received by a data receiving unit 1307.

The data receiving unit 1307 includes an amplifier 1308, CDR 1309, a deserializer 910, a decoder 911, and a data reception section 912.

The amplifier 1308 amplifies the differential input data signal output from the serializer 1305 into an amplitude level receivable by the CDR 1309.

The data signal output from the amplifier 1308 is received by the CDR 1309. Any one of the types of CDR according to the above-described first, second, and third embodiments is used as the CDR 1309.

A reproduced data signal and a reproduced clock signal output from the CDR 1309 are received by the deserializer 1310. The deserializer 1310 performs serial-to-parallel conversion on the reproduced data signal.

The modulated data output from the deserializer 1310 is received by a decoder 1311. The decoder 1311 decodes (demodulates) the modulated data in accordance with the encoding method performed by the encoder 1304. The data demodulated by the decoder 1311 is received by a data reception section 1312.

Although the data transmission/reception system 1301 illustrated in FIG. 13 is in differential connection, the data transmission/reception system 1301 may be in a single-phase connection. In such a case, the amplifier 1308 is unnecessary.

Although the data transmission unit 1302 is connected to the data receiving unit 1307 by signal lines, a storage medium such as an optical disc may be provided in place of the signal lines. In such a case, the data transmission unit 1302 acts as a data recording unit, and the data receiving unit 1307 acts as a data reproduction unit.

One of the phase comparison circuits according to the first and second embodiments is used as the phase comparison circuit in the CDR 1309 of the data receiving unit 1307, thereby making it possible to achieve the data receiving unit 1307 that is not significantly affected by variations in power supply voltage, and stably operates even by a low-voltage power supply. In addition, the CDR 1309 contributes to reduce cost of the data transmission/reception system 1301 as a whole, and to improve stability thereof.

In the above-described respective embodiments, the phase comparison circuit has been disclosed.

The delay circuit is provided in order to maximize a clock timing margin itself so that the D flip-flop, which reproduces a data signal in the phase comparison circuit, accurately receives the data signal.

In the first embodiment, the D latch having the same configuration as that of the first DFF is provided to add delay time equal to the optimum shift time, and logic of the terminal corresponding to the E terminal is fixed such that the data signal is constantly output to each D latch. Such a circuit configuration allows setting of delay time additionally provided with the optimum shift time without adjustment.

In the second embodiment, the variable delay circuit 1004 and the delay amount control section 1003 are provided to add delay time equal to the optimum shift time. The delay amount control section 1003 includes the DFFs each having the same configuration as that of the first DFF. In addition, the signal ¬ VCOCLK produced by inverting logic of the clock signal VCOCLK is supplied to each DFF to detect the transition timing of the data signal, so that the EXOR detects occurrence of the metastable state. Such a circuit configuration allows setting of delay time additionally provided with the optimum shift time in a simple adjustment step.

In the third embodiment, one of the phase comparison circuits according to the first and second embodiments is used in the CDR 1309 of the data receiving unit 1307, thereby making it possible to achieve the data receiving unit 907 that is not significantly affected by variations in power supply voltage, and reduces power consumption. This also contributes to reduce cost of the data transmission/reception system 1301 as a whole, and to improve stability thereof.

Although the example embodiments of the present disclosure have been described hereinbefore, the disclosure is not limited thereto, and includes other modifications, alterations, and application examples within the scope without departing from the gist of the disclosure described in appended claims.

For example, while structures of units and systems are specifically explained in detail for ease in understanding of the disclosure in the above-described example embodiments, the disclosure is not necessarily limited to such embodiments having all the described structures. In addition, part of a structure of one embodiment may be replaced with a structure of another embodiment. Furthermore, a structure of one embodiment may be additionally provided with a structure of another embodiment. In addition, part of a structure of each embodiment may be additionally provided with a structure of another embodiment, omitted, or replaced with a structure of another embodiment.

Moreover, the depicted control lines and information lines are those that are possibly necessary for explanation, namely, all control lines and information lines in a product are not necessarily depicted. Actually, almost all configurations may be considered to be interconnected to one another.

Furthermore, the technology encompasses any possible combination of some or all of the various embodiments described herein and incorporated herein.

It is possible to achieve at least the following configurations from the above-described example embodiments of the disclosure.

(1) A phase comparison circuit, including:
a first flip-flop configured to receive a data signal and a clock signal;
a second flip-flop configured to receive an output signal of the first flip-flop and a signal that is an inversion of logic of the clock signal;
a delay circuit configured to give delay time to the data signal, the delay time being equal to or longer than signal delay time from a clock terminal of the first flip-flop to a Q output terminal of the first flip-flop;
a first exclusive OR circuit configured to receive an output signal of the delay circuit and the output signal of the first flip-flop; and
a second exclusive OR circuit configured to receive the output signal of the first flip-flop and an output signal of the second flip-flop.

(2) The phase comparison circuit according to (1), wherein the delay circuit gives delay to the data signal, the delay being equal to or longer than sum of the signal delay time and setup time of the first flip-flop.

(3) The phase comparison circuit according to (1),
wherein the first flip-flop includes
a first D latch, and
a second D latch, and
wherein the delay circuit includes
a third D latch having same circuit configuration as a circuit configuration of the first D latch, and configured to receive a logic signal that maintains the first D latch to be constantly in an enable state, and
a fourth D latch having same circuit configuration as a circuit configuration of the second D latch, and configured to receive a logic signal that maintains the second D latch to be constantly in an enable state.

(4) The phase comparison circuit according to (3),
wherein the third D latch includes
a first transfer gate configured to be constantly maintained in a conductive state,
a first NOT circuit connected to the first transfer gate,
a second NOT circuit connected to the first NOT circuit, and
a third transfer gate connected to the second NOT circuit, the first transfer gate, and the first NOT circuit, and configured to be constantly maintained in a nonconductive state, and
wherein the fourth D latch includes
a second transfer gate configured to be constantly maintained in a conductive state,
a third NOT circuit connected to the second transfer gate,
a fourth NOT circuit connected to the third NOT circuit, a fourth transfer gate connected to the fourth NOT circuit, the second transfer gate, and the third NOT circuit, and configured to be constantly maintained in a nonconductive state, and a fifth NOT circuit connected to the fourth NOT circuit, the second transfer gate, and the third NOT circuit.

(5) The phase comparison circuit according to (3), wherein the third D latch includes a first NAND circuit having a first input terminal configured to receive the data signal, and a second input terminal configured to be constantly maintained to be logical true, a second NAND circuit having a first input terminal connected to an output terminal of the first NAND circuit, and a second input terminal configured to be constantly maintained to be logical true, a third NAND circuit having a first input terminal connected to the output terminal of the first NAND circuit, and a fourth NAND circuit having a first input terminal connected to an output terminal of the second NAND circuit, a second input terminal connected to an output terminal of the third NAND circuit, and an output terminal connected to a second input terminal of the third NAND circuit, and wherein the fourth D latch includes a fifth NAND circuit having a first input terminal connected to the output terminal of the third NAND circuit, and a second input terminal configured to be constantly maintained to be logical true, a sixth NAND circuit having a first input terminal connected to an output terminal of the fifth NAND circuit, and a second input terminal configured to be constantly maintained to be logical true, a seventh NAND circuit having a first input terminal connected to the output terminal of the fifth NAND circuit, an eighth NAND circuit having a first input terminal connected to an output terminal of the sixth NAND circuit, a second input terminal connected to an output terminal of the seventh NAND circuit, and an output terminal connected to a second input terminal of the seventh NAND circuit, and a NOT circuit connected to the output terminal of the eighth NAND circuit.

(6) The phase comparison circuit according to (3), wherein the third D latch includes a first P-channel MOSFET having a source connected to a power supply node, and a gate configured to receive the data signal, a second P-channel MOSFET having a source connected to a drain of the first P-channel MOSFET, and a gate configured to be constantly maintained to be logical false, a third N-channel MOSFET having a drain connected to a drain of the second P-channel MOSFET, and a gate configured to be constantly maintained to be logical true, a fourth N-channel MOSFET having a drain connected to a source of the third N-channel MOSFET, a gate configured to receive the data signal, and a source connected to a ground node, a fifth P-channel MOSFET having a source connected to the power supply node, and a gate connected to the drain of the second P-channel MOSFET, a sixth N-channel MOSFET having a drain connected to a drain of the fifth P-channel MOSFET, a gate connected to the drain of the second P-channel MOSFET, and a source connected to the ground node, a seventh P-channel MOSFET having a source connected to the power supply node, and a gate connected to the drain of the fifth P-channel MOSFET, an eighth P-channel MOSFET having a source connected to a drain of the seventh P-channel MOSFET, and a gate configured to be constantly maintained to be logical true, a ninth N-channel MOSFET having a drain connected to a drain of the eighth P-channel MOSFET and the drain of the second P-channel MOSFET, and a gate configured to be constantly maintained to be logical false, and a tenth N-channel MOSFET having a drain connected to a source of the ninth N-channel MOSFET, a gate connected to the drain of the fifth P-channel MOSFET, and a source connected to the ground node.

(7) The phase comparison circuit according to (6), wherein the fourth D latch has a circuit configuration equal to a circuit configuration of the third D latch.

(8) The phase comparison circuit according to (6), wherein the fourth D latch includes an eleventh P-channel MOSFET having a source connected to the power supply node, and a gate configured to be constantly maintained to be logical false, a twelfth P-channel MOSFET having a source connected to a drain of the eleventh P-channel MOSFET, and a gate connected to the drain of the second P-channel MOSFET, a thirteenth N-channel MOSFET having a drain connected to a drain of the twelfth P-channel MOSFET, and a gate connected to the drain of the second P-channel MOSFET, a fourteenth N-channel MOSFET having a drain connected to a source of the thirteenth N-channel MOSFET, a gate configured to be constantly maintained to be logical true, and a source connected to the ground node, a fifteenth P-channel MOSFET having a source connected to the power supply node, and a gate connected to the drain of the twelfth P-channel MOSFET, a sixteenth N-channel MOSFET having a drain connected to a drain of the fifteenth P-channel MOSFET, a gate connected to the drain of the twelfth P-channel MOSFET, and a source connected to the ground node, a seventeenth P-channel MOSFET having a source connected to the power supply node, and a gate connected to the drain of the fifteenth P-channel MOSFET, an eighteenth P-channel MOSFET having a source connected to a drain of the seventeenth P-channel MOSFET, and a gate configured to be constantly maintained to be logical true, a nineteenth N-channel MOSFET having a drain connected to a drain of the eighteenth P-channel MOSFET and the drain of the twelfth P-channel MOSFET, and a gate configured to be constantly maintained to be logical false, and a twentieth N-channel MOSFET having a drain connected to a source of the nineteenth N-channel MOSFET, a gate connected to the drain of the fifteenth P-channel MOSFET, and a source connected to the ground node.

(9) The phase comparison circuit according to (2), wherein the delay circuit is a variable delay circuit configured to be variably controlled in delay time by a delay amount control section, the delay amount control section being configured to set the delay time.

(10) The phase comparison circuit according to (9), wherein the delay amount control section includes a third flip-flop having same circuit configuration as a circuit configuration of the first flip-flop, and having a D terminal configured to receive the data signal, and a clock terminal configured to receive the signal that is the inversion of logic of the clock signal, and a delay control circuit configured to detect occurrence of timing violation of setup time or holding time by the third flip-flop, and variably control the delay time.

(11) A data receiving unit, including:
 a clock and data recovery circuit including a phase comparison circuit, an oscillator, a frequency divider, a frequency phase comparison circuit, a lock detector, and a multiplexer;
 a deserializer; and
 a decoder,
 wherein the phase comparison circuit includes
 a first flip-flop configured to receive a data signal and a clock signal,
 a second flip-flop configured to receive an output signal of the first flip-flop and a signal that is an inversion of logic of the clock signal,
 a delay circuit configured to give delay time to the data signal, the delay time being equal to or longer than signal delay time from a clock terminal of the first flip-flop to a Q output terminal of the first flip-flop,
 a first exclusive OR circuit configured to receive an output signal of the delay circuit and the output signal of the first flip-flop, and
 a second exclusive OR circuit configured to receive the output signal of the first flip-flop and an output signal of the second flip-flop,
 the oscillator is configured to output the clock signal,
 the frequency divider is configured to output a feedback clock signal that is a division of the clock signal in a predetermined dividing ratio,
 the frequency phase comparison circuit is configured to output a signal that corresponds to a frequency difference and a phase difference between the data signal and the feedback clock signal,
 the lock detector is configured to output a determination signal that indicates whether each of the frequency difference and the phase difference between the data signal and the feedback clock signal is within a predetermined range or not, and
 the multiplexer is configured to receive the determination signal, and select one of a signal from the phase comparison circuit and a signal from the frequency phase comparison circuit,
 wherein the deserializer is configured to perform serial-to-parallel conversion on the data signal with use of the clock signal, and
 wherein the decoder is configured to decode modulated data output from the deserializer.
(12) The data receiving unit according to (11), further including:
 a charge pump configured to receive an output signal of the multiplexer, and
 a loop filter configured to smooth an output signal of the charge pump, and supply the smoothed signal to the oscillator,
 wherein the oscillator is a voltage control oscillator.
(13) The data receiving unit according to (12), wherein the delay circuit gives delay to the data signal, the delay being equal to or longer than sum of the signal delay time and setup time of the first flip-flop.
(14) The data receiving unit according to (12),
 wherein the first flip-flop includes
 a first D latch, and
 a second D latch, and
 wherein the delay circuit includes
 a third D latch having same circuit configuration as a circuit configuration of the first D latch, and configured to receive a logic signal that maintains the first D latch to be constantly in an enable state, and
 a fourth D latch having same circuit configuration as a circuit configuration of the second D latch, and configured to receive a logic signal that maintains the second D latch to be constantly in an enable state.
(15) The data receiving unit according to (12), further including a delay amount control section configured to set the delay time,
 wherein the delay circuit is a variable delay circuit configured to be variably controlled in delay time by the delay amount control section.
(16) A phase comparison circuit, including:
 a first flip-flop configured to receive a data signal and a clock signal;
 a second flip-flop configured to receive an output signal of the first flip-flop and a signal that is an inversion of logic of the clock signal;
 a delay circuit having a logical step number equal to or larger than a logical step number of the first flip-flop, and configured to give delay time to the data signal;
 a first exclusive OR circuit configured to receive an output signal of the delay circuit and the output signal of the first flip-flop; and
 a second exclusive OR circuit configured to receive the output signal of the first flip-flop and an output signal of the second flip-flop.
(17) The phase comparison circuit according to (16),
 wherein the first flip-flop includes
 a first D latch, and
 a second D latch, and
 wherein the delay circuit includes
 a third D latch having same circuit configuration as a circuit configuration of the first D latch, and configured to receive a logic signal that maintains the first D latch to be constantly in an enable state, and
 a fourth D latch having same circuit configuration as a circuit configuration of the second D latch, and configured to receive a logic signal that maintains the second D latch to be constantly in an enable state.

It should be understood by those skilled in the art that various modifications, combinations, sub-combinations and alterations may occur depending on design requirements and other factors insofar as they are within the scope of the appended claims or the equivalents thereof.

What is claimed is:

1. A phase comparison circuit, comprising:
 a first flip-flop configured to receive a data signal and a clock signal;
 a second flip-flop configured to receive an output signal of the first flip-flop and a signal that is an inversion of logic of the clock signal;
 a delay circuit configured to give delay time to the data signal, the delay time being equal to or longer than signal delay time from a clock terminal of the first flip-flop to a Q output terminal of the first flip-flop;
 a first exclusive OR circuit configured to receive an output signal of the delay circuit and the output signal of the first flip-flop; and
 a second exclusive OR circuit configured to receive the output signal of the first flip-flop and an output signal of the second flip-flop, wherein,
the first flip-flop includes a first D latch and a second D latch, and
the delay circuit includes:
a third D latch having same circuit configuration as a circuit configuration of the first D latch and configured to receive a logic signal that maintains the first D latch to be constantly in an enable state, and
a fourth D latch having same circuit configuration as a circuit configuration of the second D latch and configured to receive a logic signal that maintains the second D latch to be constantly in an enable state.

2. The phase comparison circuit according to claim 1, wherein the delay circuit gives delay to the data signal, the delay being equal to or longer than sum of the signal delay time and a setup time of the first flip-flop.

3. The phase comparison circuit according to claim 1, wherein the third D latch includes
a first transfer gate configured to be constantly maintained in a conductive state,
a first NOT circuit connected to the first transfer gate,
a second NOT circuit connected to the first NOT circuit, and
a third transfer gate connected to the second NOT circuit, the first transfer gate, and the first NOT circuit, and configured to be constantly maintained in a nonconductive state, and
wherein the fourth D latch includes
a second transfer gate configured to be constantly maintained in a conductive state,
a third NOT circuit connected to the second transfer gate,
a fourth NOT circuit connected to the third NOT circuit,
a fourth transfer gate connected to the fourth NOT circuit, the second transfer gate, and the third NOT circuit, and configured to be constantly maintained in a nonconductive state, and
a fifth NOT circuit connected to the fourth NOT circuit, the second transfer gate, and the third NOT circuit.

4. A data receiving unit, comprising:
a clock and data recovery circuit including a phase comparison circuit, an oscillator, a frequency divider, a frequency phase comparison circuit, a lock detector, and a multiplexer;
a deserializer;
a decoder,
a charge pump configured to receive an output signal of the multiplexer, and
a loop filter configured to smooth an output signal of the charge pump and supply the smoothed signal to the oscillator, wherein the oscillator is a voltage control oscillator,
wherein,
the phase comparison circuit includes
a first flip-flop configured to receive a data signal and a clock signal,
a second flip-flop configured to receive an output signal of the first flip-flop and a signal that is an inversion of logic of the clock signal,
a delay circuit configured to give delay time to the data signal, the delay time being equal to or longer than signal delay time from a clock terminal of the first flip-flop to a Q output terminal of the first flip-flop,
a first exclusive OR circuit configured to receive an output signal of the delay circuit and the output signal of the first flip-flop, and
a second exclusive OR circuit configured to receive the output signal of the first flip-flop and an output signal of the second flip-flop,
the oscillator is configured to output the clock signal,
the frequency divider is configured to output a feedback clock signal that is a division of the clock signal in a predetermined dividing ratio,
the frequency phase comparison circuit is configured to output a signal that corresponds to a frequency difference and a phase difference between the data signal and the feedback clock signal,
the lock detector is configured to output a determination signal that indicates whether each of the frequency difference and the phase difference between the data signal and the feedback clock signal is within a predetermined range or not,
the multiplexer is configured to receive the determination signal, and select one of a signal from the phase comparison circuit and a signal from the frequency phase comparison circuit,
the deserializer is configured to perform serial-to-parallel conversion on the data signal with use of the clock signal,
the decoder is configured to decode modulated data output from the deserializer,
the first flip-flop includes a first D latch, and a second D latch, and
the delay circuit includes
a third D latch having same circuit configuration as a circuit configuration of the first D latch and configured to receive a logic signal that maintains the first D latch to be constantly in an enable state, and
a fourth D latch having same circuit configuration as a circuit configuration of the second D latch and configured to receive a logic signal that maintains the second D latch to be constantly in an enable state.

5. The data receiving unit according to claim 4, wherein the delay circuit gives delay to the data signal, the delay being equal to or longer than sum of the signal delay time and a setup time of the first flip-flop.

6. A phase comparison circuit, comprising:
a first flip-flop configured to receive a data signal and a clock signal;
a second flip-flop configured to receive an output signal of the first flip-flop and a signal that is an inversion of logic of the clock signal;
a delay circuit having a logical step number equal to or larger than a logical step number of the first flip-flop, and configured to give delay time to the data signal;
a first exclusive OR circuit configured to receive an output signal of the delay circuit and the output signal of the first flip-flop; and
a second exclusive OR circuit configured to receive the output signal of the first flip-flop and an output signal of the second flip-flop,
wherein,
the first flip-flop includes a first D latch, and a second D latch, and
the delay circuit includes
a third D latch having same circuit configuration as a circuit configuration of the first D latch and configured to receive a logic signal that maintains the first D latch to be constantly in an enable state, and a fourth D latch having same circuit configuration as a circuit configuration of the second D latch, and configured to receive a logic signal that maintains the second D latch to be constantly in an enable state.

* * * * *